United States Patent
Gajek et al.

(10) Patent No.: US 11,342,498 B2
(45) Date of Patent: May 24, 2022

(54) HIGH DENSITY 3D MAGNETIC RANDOM ACCESS MEMORY (MRAM) CELL INTEGRATION USING WAFER CUT AND TRANSFER

(71) Applicant: Integrated Silicon Solution, (Cayman) Inc., Grand Cayman (KY)

(72) Inventors: Marcin Gajek, Berkeley, CA (US); Kuk-Hwan Kim, San Jose, CA (US); Dafna Beery, Palo Alto, CA (US); Amitay Levi, Cupertino, CA (US)

(73) Assignee: Integrated Silicon Solution (Cayman) Inc., Grand Cayman (KY)

( * ) Notice: Subject to any disclaimer, the term of this patent is extended or adjusted under 35 U.S.C. 154(b) by 201 days.

(21) Appl. No.: 15/865,118

(22) Filed: Jan. 8, 2018

(65) Prior Publication Data

US 2019/0214552 A1 Jul. 11, 2019

(51) Int. Cl.
*H01L 43/08* (2006.01)
*H01L 43/12* (2006.01)
*G11C 11/15* (2006.01)
*G11C 11/16* (2006.01)
*G11C 13/00* (2006.01)

(52) U.S. Cl.
CPC .............. *H01L 43/12* (2013.01); *G11C 11/15* (2013.01); *G11C 11/161* (2013.01); *G11C 11/1659* (2013.01); *H01L 43/08* (2013.01); *G11C 13/0002* (2013.01); *H01L 2924/10253* (2013.01)

(58) Field of Classification Search
CPC ................... H01L 21/30604; H01L 21/76254
See application file for complete search history.

(56) References Cited

U.S. PATENT DOCUMENTS

| | | | |
|---|---|---|---|
| 5,882,987 A | 3/1999 | Srikrishnan | |
| 6,048,411 A * | 4/2000 | Henley | B81C 1/0038 |
| | | | 148/33.5 |
| 6,083,324 A * | 7/2000 | Henley | H01L 21/2007 |
| | | | 148/33.2 |

(Continued)

OTHER PUBLICATIONS

Di Cioccio et al., "Silicon carbide on insulator formation using the Smart Cut process," Electronics Letters, vol. 32, No. 12, Jun. 1996, pp. 1144-1145.
Bruel et al., "'Smart Cut': A Promising New SOI Material Technology," Proceedings 1995 IEEE International SO1 Conference, Oct. 1995, pp. 178-179.

(Continued)

*Primary Examiner* — Jaehwan Oh

(57) ABSTRACT

In accordance with one embodiment, a method includes forming a cleavable donor substrate, the substrate including monocrystalline Si, forming a dielectric layer above the substrate in a film thickness direction, and cleaving the substrate into an upper portion having the dielectric layer and a lower portion. In one embodiment, the cleavable substrate is formed using a sacrificial buffer layer above the substrate in the film thickness direction, and forming a strained Si layer above the sacrificial buffer layer in the film thickness direction, followed by etching away the sacrificial buffer layer to cleave the substrate. In another embodiment, the cleavable substrate is formed by implanting ions into the substrate to a peak implant position located below an upper surface of the substrate, annealing the substrate and dielectric layer in an inert environment to form blisters at the peak implant position, and cleaving the substrate using the blisters.

13 Claims, 22 Drawing Sheets

(56) References Cited

U.S. PATENT DOCUMENTS

| | | | |
|---|---|---|---|
| 6,486,008 B1* | 11/2002 | Lee | H01L 21/76254 257/E21.568 |
| 7,148,124 B1* | 12/2006 | Usenko | H01L 21/76254 438/458 |
| 2004/0102057 A1* | 5/2004 | Liu | H01L 21/324 438/795 |
| 2005/0239280 A1* | 10/2005 | Lee | H01L 23/5329 438/624 |
| 2007/0249139 A1* | 10/2007 | Gadkaree | H01L 21/76254 438/458 |
| 2007/0287269 A1* | 12/2007 | Yokokawa | H01L 21/76254 438/478 |
| 2009/0075453 A1* | 3/2009 | Murakami | H01L 21/76254 438/406 |
| 2012/0001293 A1* | 1/2012 | Ben Mohamed | H01L 21/185 257/506 |
| 2012/0228613 A1* | 9/2012 | Seki | H01L 29/0684 257/52 |
| 2015/0041863 A1* | 2/2015 | Johnson | H01L 31/0687 257/201 |
| 2015/0056730 A1* | 2/2015 | Hwang | H01L 33/647 438/33 |
| 2015/0137187 A1* | 5/2015 | Aoki | H01L 21/30612 257/201 |
| 2017/0025306 A1* | 1/2017 | Wang | H01L 21/02592 |
| 2017/0051884 A1* | 2/2017 | Raring | H01S 5/02469 |
| 2017/0200715 A1* | 7/2017 | Sekar | H01L 21/76254 |

OTHER PUBLICATIONS

Tong et al., "Low Temperature Si Layer Splitting," Proceedings 1997 IEEE International SOI Conference, Oct. 1997, pp. 126-127.

Tong et al., "A 'smarter-cut' approach to low temperature silicon layer transfer," Applied Physics Letters, vol. 72, No. 1, Jan. 1998, pp. 49-51.

Aspar et al., "Smart-Cut process using metallic bonding: Application to transfer of Si, GaAs, InP thin films," Electronics Letters, vol. 35, No. 12, Jun. 1999, pp. 1024-1025.

Bruel et al., "Smart-Cut: A New Silicon on Insulator Material Technology Based on Hydrogen Implantation and Wafer Bonding," Japanese Journal of Applied Physics, vol. 36, Part 1, No. 3B, Mar. 1997, pp. 1636-1641.

Bruel M., "The History, Physics, and Applications of the Smart-Cut Process," MRS Bulletin, Dec. 1998, pp. 35-39.

Sawlik et al., "GaAs on Si: towards a low-temperature 'smart-cut' technology," Vacuum, vol. 70, 2003, pp. 103-107.

Ghyselen et al., "Engineering strained silicon on insulator wafers with the Smart Cut technology," Solid-State Electronics, vol. 48, 2004, pp. 1285-1296.

Maleville et al., "Smart-Cut technology: from 300 mm ultrathin SOI production to advanced engineered substrates," Solid-State Electrocincs, vol. 48, 2004, pp. 1055-1063.

Takagi et al., "Surface activated bonding of silicon wafers at room temperature," Applied Physics Letters, vol. 68, No. 16, Apr. 15, 1996, pp. 2222-2224.

* cited by examiner

HIGH DENSITY 3D MAGNETIC RANDOM ACCESS MEMORY (MRAM) CELL INTEGRATION USING WAFER CUT AND TRANSFER

FIELD OF THE INVENTION

The present invention relates to magnetic random access memory (MRAM), and more particularly to high density 3D MRAM cell integration using wafer cut and transfer.

BACKGROUND

Magnetic Random Access Memory (MRAM) is a non-volatile data memory technology that stores data using magnetoresistive cells, such as Magnetoresistive Tunnel Junction (MTJ) elements. At their most basic level, such MTJ elements include first and second magnetic layers that are separated by a thin, non-magnetic tunnel barrier layer, which may be constructed of an insulating barrier material, such as MgO, $Al_2O_3$, etc. The first magnetic layer, which may be referred to as a reference layer, has a magnetization that is fixed in a direction that is perpendicular to that of a plane of the layer. The second magnetic layer has a magnetization that is free to move so that it may be oriented in either of two directions that are both generally perpendicular to the plane of the free magnetic layer. Therefore, the magnetization of the free layer may be either parallel with the magnetization of the reference layer or anti-parallel with the direction of the reference layer (i.e., opposite to the direction of the reference layer).

The electrical resistance through the MTJ element in a direction perpendicular to the planes of the layers changes with the relative orientations of the magnetizations of the magnetic reference layer and magnetic free layer. When the magnetization of the magnetic free layer is oriented in the same direction as the magnetization of the magnetic reference layer, the electrical resistance through the MTJ element is at its lowest electrical resistance state. Conversely, when the magnetization of the magnetic free layer is in a direction that is opposite to that of the magnetic reference layer, the electrical resistance across the MTJ element is at its highest electrical resistance state.

The switching of the MTJ element between high and low resistance states results from electron spin transfer. Each electron has a spin orientation. Generally, electrons flowing through a conductive material have random spin orientations with no net spin orientation. However, when electrons flow through a magnetized layer, the spin orientations of the electrons become aligned so that there is a net aligned orientation of electrons flowing through the magnetic layer, and the orientation of this alignment is dependent on the orientation of the magnetization of the magnetic layer through which they travel. When the orientations of the magnetizations of the free layer and the reference layer are oriented in the same direction, the spin of the electrons in the free layer are generally in the same direction as the orientation of the spin of the electrons in the reference layer. Because these electron spins are generally in the same direction, the electrons may pass relatively easily through the tunnel barrier layer. However, if the orientations of the magnetizations of the free layer and the reference layer are opposite to one another, the spin of electrons in the free layer will generally be opposite to the spin of electrons in the reference layer. In this case, electrons do not easily pass through the barrier layer, resulting in a higher electrical resistance through the MTJ stack.

Because the MTJ element may be switched between low and high electrical resistance states, it may be used as a memory element to store data. For example, the low resistance state may be read as a "1" or one, whereas the high resistance state may be read as a "0" or zero. In addition, because the magnetic orientation of the magnetic free layer remains in its switched state without any electrical power being provided to the element, the memory storage provided by the MTJ element is robust and non-volatile.

To write a bit of data to the MTJ cell, the magnetic orientation of the magnetic free layer is switched from a first direction to a second direction that is 180° from the first direction. This may be accomplished, for example, by applying a current through the MTJ element in a direction that is perpendicular to the planes of the layers of the MTJ element. An electrical current applied in one direction will switch the magnetization of the free layer to a first orientation, whereas an electrical current applied in a second direction will switch the magnetic of the free layer to a second, opposite orientation.

Once the magnetization of the free layer has been switched by the current, the state of the MTJ element may be read by detecting a voltage across the MTJ element, thereby determining whether the MTJ element is in a "1" or "0" bit state. Advantageously, once the switching electrical current has been removed, the magnetic state of the free layer will remain in the switched orientation until some other time when an electrical current is applied to switch the MTJ element to the opposite state. Therefore, the recorded data bit is non-volatile in that it remains intact (the magnetic orientation of the free layer does not change) in the absence of any electrical current being supplied.

SUMMARY

According to one embodiment, a method includes implanting ions into a donor substrate to a peak implant position located below an upper surface of the donor substrate in a film thickness direction, forming a dielectric layer above the donor substrate in the film thickness direction, annealing the donor substrate and dielectric layer in an inert environment to form blisters at the peak implant position, and cleaving an upper portion of the donor substrate from a lower portion of the donor substrate using the blisters.

In another embodiment, a method includes forming a sacrificial buffer layer above a donor substrate in a film thickness direction, forming a strained Si layer above the sacrificial buffer layer in the film thickness direction, forming a dielectric layer above the strained Si layer in the film thickness direction, and etching away the sacrificial buffer layer with the proviso that no other layer is removed.

In accordance with another embodiment, a method includes forming a cleavable donor substrate, the donor substrate including monocrystalline Si, forming a dielectric layer above the donor substrate in a film thickness direction, and cleaving the donor substrate into an upper portion having the dielectric layer and a lower portion.

These and other features and advantages of the invention will be apparent to one of skill in the art upon reading of the following detailed description of the embodiments in conjunction with the figures. In the figures, like reference numerals used in more than one figure indicate a like element, and may be considered in light of the description of the like element presented in any of the other figures having the like element.

BRIEF DESCRIPTION OF THE DRAWINGS

For a fuller understanding of the nature and advantages of this invention, as well as the preferred mode of use, reference should be made to the following detailed description read in conjunction with the accompanying drawings. The drawings are not presented to scale unless specified otherwise on an individual basis.

DETAILED DESCRIPTION

The following description includes the best embodiments presently contemplated for carrying out the invention. This description is made for the purpose of illustrating the general principles of this invention and is not meant to limit the inventive concepts claimed herein in any way.

Unless otherwise specifically defined herein, all terms are to be given their broadest possible interpretation including meanings implied from the specification as well as meanings understood by those skilled in the art and/or as defined in dictionaries, treatises, etc. It must also be noted that, as used in the specification and the appended claims, the singular forms "a," "an," and "the" include plural referents unless otherwise specified.

Moreover, the term "about" when used herein to modify a value indicates a range that includes the value and less and greater than the value within a reasonable range. In the absence of any other indication, this reasonable range is plus and minus 10% of the value. For example, "about 10 nanometers" indicates 10 nm±1 nm, such that the range includes all values in a range including 9 nm up to and including 11 nm.

Also, the term "comprise" indicates an inclusive list of those elements specifically described without exclusion of any other elements. For example, "a list comprises red and green" indicates that the list includes, but is not limited to, red and green. Therefore, the list may also include other colors not specifically described.

According to one general embodiment, a method includes implanting ions into a donor substrate to a peak implant position located below an upper surface of the donor substrate in a film thickness direction, forming a dielectric layer above the donor substrate in the film thickness direction, annealing the donor substrate and dielectric layer in an inert environment to form blisters at the peak implant position, and cleaving an upper portion of the donor substrate from a lower portion of the donor substrate using the blisters.

In another general embodiment, a method includes forming a sacrificial buffer layer above a donor substrate in a film thickness direction, forming a strained Si layer above the sacrificial buffer layer in the film thickness direction, forming a dielectric layer above the strained Si layer in the film thickness direction, and etching away the sacrificial buffer layer with the proviso that no other layer is removed.

In accordance with another general embodiment, a method includes forming a cleavable donor substrate, the donor substrate including monocrystalline Si, forming a dielectric layer above the donor substrate in a film thickness direction, and cleaving the donor substrate into an upper portion having the dielectric layer and a lower portion.

Figure 1:
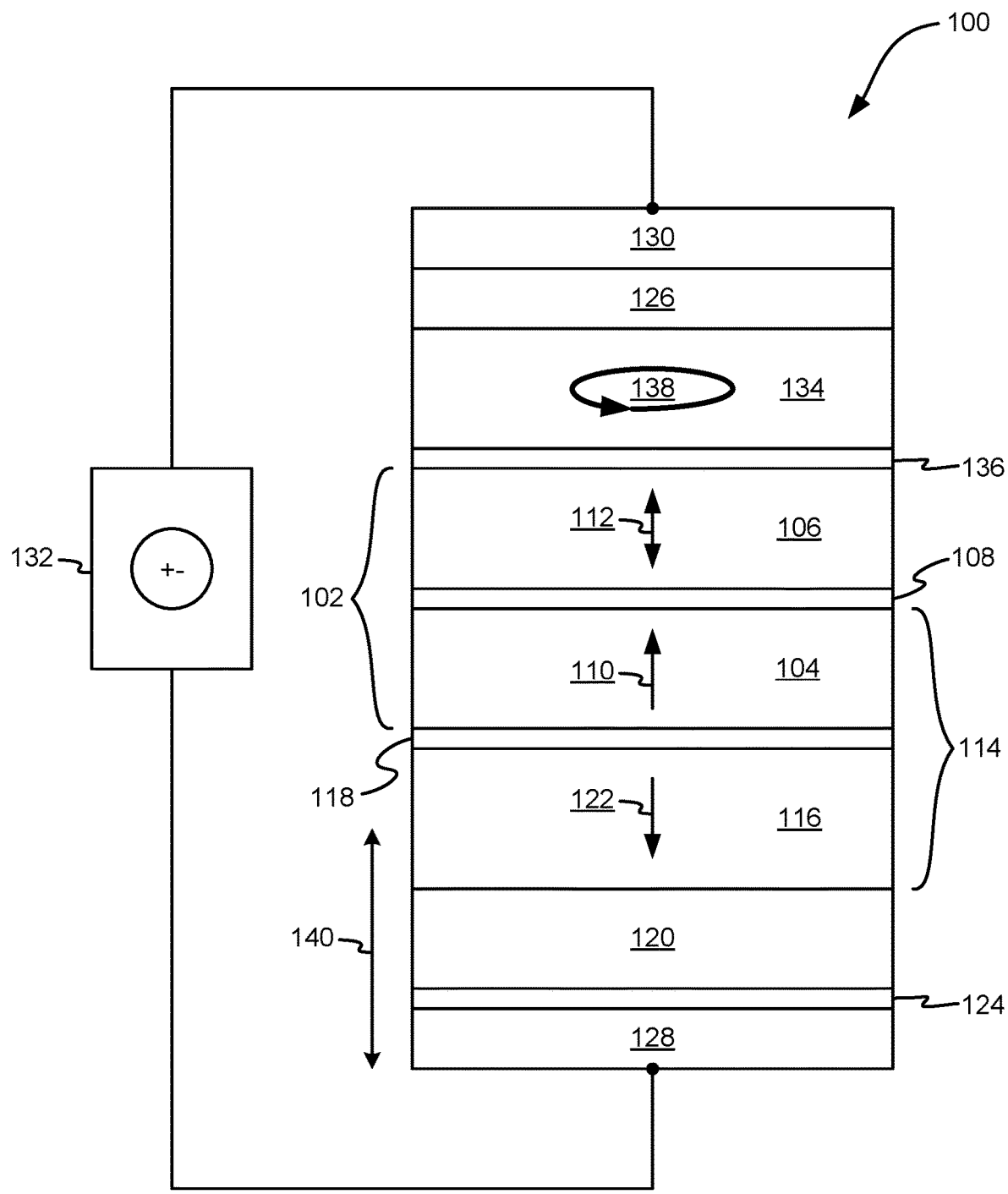
FIG. 1 is a schematic, cross-sectional view of a portion of a magnetic memory element, which may be used in embodiments of the invention.

Referring to FIG. 1, a magnetic memory element 100 is shown according to one embodiment. The memory element 100 may be used in a perpendicular magnetic tunnel junction (pMTJ) memory element, as described in various embodiments herein. The memory element 100 may include a magnetic tunnel junction (MTJ) 102 that may include a magnetic reference layer 104, a magnetic free layer 106, and a thin, non-magnetic, electrically-insulating magnetic barrier layer 108 positioned between the reference layer 104 and the free layer 106 in a film thickness direction 140. The barrier layer 108 may include an oxide, such as MgO, $Al_2O_3$, etc., or some other suitable material known in the art. The reference layer 104 has a magnetization 110 that is fixed in a direction that is perpendicular to a horizontal plane of the layer, as indicated by the arrow. The horizontal plane is sometimes referred to as a plane of formation in the embodiments described herein. The free layer 106 has a magnetization 112 that may be in either of two directions perpendicular to a horizontal plane of the free layer 106, as indicated by the two arrows. While the magnetization 112 of the free layer 106 remains in either of two directions perpendicular to the plane of the free layer 106 in a quiescent state, it may be selectable switched between these two directions, as is described in greater detail herein. When the magnetization 112 of the free layer 106 is in the same direction as the magnetization 110 of the reference layer 104, the electrical resistance across the MTJ 102 is at a low resistance state. Conversely, when the magnetization 112 of the free layer 106 is opposite to the magnetization 110 of the reference layer 104, the electrical resistance across the MTJ 102 is in a high resistance state.

The reference layer 104 may be part of an anti-parallel magnetic pinning structure 114 that may include a magnetic pinned layer 116 and a non-magnetic, antiparallel coupling layer 118 positioned between the pinned layer 116 and the reference layer 104 in the film thickness direction 140. The antiparallel coupling layer 118 may comprise any suitable material known in the art, such as Ru, and may be constructed to have a thickness that causes ferromagnetic antiparallel coupling of the pinned layer 116 and the reference layer 104.

In one approach, the pinned layer 116 may be exchange coupled with an antiferromagnetic layer 120, which may comprise any suitable material known in the art, such as IrMn, PtMn, etc. Exchange coupling between the antiferromagnetic layer 120 and the pinned layer 116 strongly pins the magnetization 122 of the pinned layer 116 in a first direction. The antiparallel coupling between the pinned layer 116 and the reference layer 104 pins the magnetization 110 of the reference layer 104 in a second direction opposite to the direction of magnetization 122 of the pinned layer 116.

According to one approach, a seed layer 124 may be positioned below the pinned layer 116 in the film thickness direction 140 to initiate a desired crystalline structure in the layers deposited thereabove.

In another approach, a capping layer 126 may be positioned above the free layer 106 to protect the underlying layers during manufacture, such as during high temperature annealing.

A lower electrode 128 and an upper electrode 130 may be positioned near a bottom and a top of the memory element 100, respectively, in one approach. The lower electrode 128 and the upper electrode 130 may be constructed of a non-magnetic, electrically conductive material of a type known in the art, such as Ru, Cu, etc., and may provide an electrical connection with a circuit 132. The circuit 132 may include a current source, and may further include circuitry for reading an electrical resistance across the memory element 100.

The magnetic free layer 106 has a magnetic anisotropy that causes the magnetization 112 of the free layer 106 to remain stable in one of two directions perpendicular to the horizontal plane of the free layer 106. In a write mode of use for the memory element 100, the orientation of the magnetization 112 of the free layer 106 may be switched between these two directions by applying an electrical current through the memory element 100 via the circuit 132. A current in a first direction causes the magnetization 112 of the free layer 106 of the memory element 100 to flip to a first orientation, and a current in a second direction opposite to the first direction causes the magnetization 112 of the free layer 106 of the memory element 100 to flip to a second, opposite direction.

For example, if the magnetization 112 is initially oriented in an upward direction in FIG. 1, applying a current in a downward direction through the memory element 100 causes electrons to flow in an opposite direction upward through the memory element 100. Electrons travelling through the reference layer 104 become spin polarized as a result of the magnetization 110 of the reference layer 104. These spin-polarized electrons cause a spin torque on the magnetization 112 of the free layer 106, which causes the magnetization 112 to flip directions, from the upward direction to a downward direction.

On the other hand, if the magnetization 112 of the free layer 106 is initially in a downward direction in FIG. 1, applying an electrical current through the memory element 100 in an upward direction in FIG. 1 causes electrons to flow in an opposite direction, downward through the memory element 100. However, because the magnetization 112 of the free layer 106 is opposite to the magnetization 110 of the reference layer 104, the electrons will not be able to pass through the barrier layer 108. As a result, the electrons (which have been spin polarized by the magnetization 112 of the free layer 106) will accumulate at the junction between the free layer 106 and the barrier layer 108. This accumulation of spin polarized electrons causes a spin torque that causes the magnetization 112 of the free layer 106 to flip from the downward direction to an upward direction.

In order to assist the switching of the magnetization 112 of the free layer 106, the memory element 100 may include a spin polarization layer 134 positioned above the free layer 106. The spin polarization layer 134 may be separated from the free layer 106 by an exchange coupling layer 136. The spin polarization layer 134 has a magnetic anisotropy that causes it to have a magnetization 138 with a primary component oriented in the in plane direction (e.g., perpendicular to the magnetization 112 of the free layer and the magnetization 110 of the reference layer 104). The magnetization 138 of the spin polarization layer 134 may be fixed in one approach, or may move in a precessional manner as shown in FIG. 1. The magnetization 138 of the spin polarization layer 134 causes a spin torque on the free layer 106 that assists in moving its magnetization 112 away from its quiescent state perpendicular to the plane of the free layer 106. This allows the magnetization 112 of the free layer 106 to more easily flip with less energy being utilized to flip the magnetization 112 in response to applying a write current to the memory element 100.

The memory element 100 described in FIG. 1 is intended to provide context to the various embodiments described herein. The structures and methods described herein in accordance with various embodiments may comprise a portion of the memory element 100 described in FIG. 1 and/or used in conjunction with the memory element 100, in various approaches.

Figure 2:
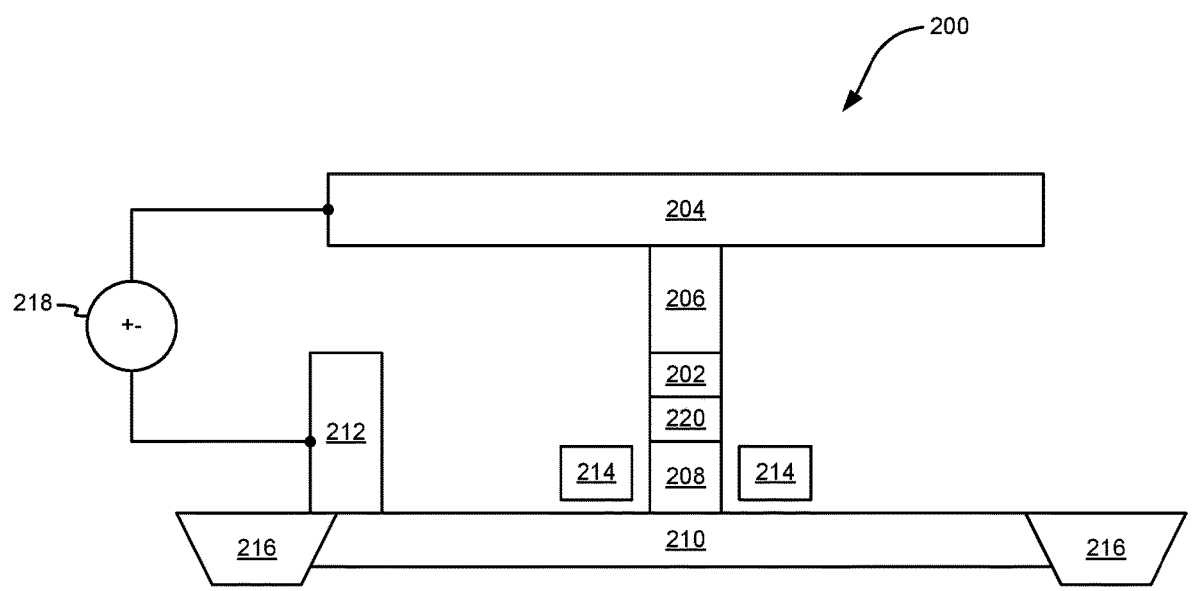
FIG. 2 is a schematic, cross-sectional view of a portion of a magnetic random access memory (MRAM) that includes a magnetoresistive sensor, which may be used in embodiments of the invention.

Now referring to FIG. 2, a portion of a magnetic random access memory (MRAM) structure 200 that includes a magnetoresistive sensor 202 is shown according to one embodiment. The MRAM structure 200 may be operated and utilized as understood by those of skill in the art, with any special use cases being specified in accordance with an embodiment herein. The memory element 100 described in FIG. 1 may be used as the magnetoresistive sensor 202 of FIG. 2 in accordance with embodiments that store data in MRAM. In one embodiment, an MTJ element may be used as the magnetoresistive sensor 202.

The MRAM structure 200 includes a bit line 204 that supplies current across the magnetoresistive sensor 202 from a voltage source 218. The bit line 204 may comprise any suitable material known in the art, such as TaN, W, TiN, Au, Ag, Cu, etc. An extension layer 206 electrically couples the magnetoresistive sensor 202 with the bit line 204. The extension layer 206 may comprise any suitable material known in the art, such as Ru, Ta, etc. A source terminal 220 is coupled between the magnetoresistive sensor 202 and a channel layer 208, which is in electrical contact with a n+ source layer 210. The channel layer 208 may comprise any suitable semiconductor material known in the art, such as Si, Ge, GaAs-compounds, etc. The n+ source layer 210 may comprise any suitable material known in the art, such as TaN, W, TiN, Au. Ag, Cu, etc., and is electrically coupled to the voltage source 218 via a source line 212, which may comprise any suitable material known in the art, such as TaN, W, TiN, Au, Ag, Cu, etc. Positioned across the channel layer 208 is a word line 214 which may comprise any suitable material known in the art, such as TaN, W, TiN, Au, Ag, Cu, etc. On either side of the n+ source layer 210 are shallow trench isolation (STI) layers 216 which provide electrical insulation between an adjacent n+ source layer 210. Moreover, although not specifically shown, electrically insulative material may be positioned around the various layers shown in FIG. 2, as would be understood by one of skill in the art.

Silicon channels that are used to connect conventional MTJs show low field effect mobility compared to III-V semiconductor channels which are constructed of materials such as InGaAs, InAs, etc. The current used during operation of a pMTJ is greater than that used by a typical MTJ during operation. Therefore, a silicon channel semiconductor, which is typically used to deliver voltage to a MTJ is not able to handle the current load of a pMTJ during write operation, e.g., 6-10 mega-ampere per square centimeter (MA/cm$^2$), when a silicon channel is configured to have a minimum size allowed in certain complementary metaloxide-semiconductor (CMOS) technologies. Therefore, it is desirable to utilize a compound semiconductor channel as an access transistor for a pMTJ memory array.

As memory architectures scale down below 20 nm, production of the minute elements that form the memory systems faces many challenges. One of the main difficulties lies in the increasingly complex integration of the many different elements, and downward scaling is widely expected to be halted at about the 1× nm size regime. This difficulty has prompted the memory industry to look towards different advanced memory technologies, including spin torque MRAM. It is possible that MRAM will have better scaling prospects below 20 nm; however, there are challenges with MRAM as well, some of which are related to the materials used in fabrication of the elements of the MRAM (e.g., retention, switching characteristics, thermal robustness of the stack, etc.) and other issues related to the integration scheme with some limitations with regards to the pitch between bits, and therefore bit density. One interesting path that may be used to increase memory density is to utilize vertical arrangements. MRAM lends itself better to 3D integration compared to other memory architectures, such as dynamic random access memory (DRAM), because of the smaller vertical aspect ratio of approximately 3:1 (versus a 50:1 aspect ratio for DRAM).

According to embodiments described herein, a large number of layers of MRAM cells may be stacked vertically along with associated complementary metal-oxide-semiconductor (CMOS) logic control circuitry compatible to effectively operate the MRAM. More specifically, formation of an epitaxial Si wafer (an epi-Si layer) that serves as a base for each subsequent level of vertical field effect transistors (FETs) while respecting thermal limitations of the MRAM cell.

One of the challenges facing any 3D integration scheme is to fabricate a subsequent structure (e.g., CMOS logic) on the next level above a previously formed metal and/or dielectric encapsulation layer. Those layers, either dielectric or metallic, are amorphous or may be poorly textured which hampers the formation of a subsequent epitaxial Si layer that is used to form CMOS logic devices, e.g., metal-oxide-semiconductor field-effect transistor (MOSFETs), pMTJs, etc. Various approaches to overcome this issue are described below, that utilize wafer cut, transfer, and bonding techniques that may be applied to MRAM stacks for building large vertical devices with the possibility of including tens or hundreds of MRAM stacks therein.

Now referring to FIGS. 3A-3E, formation of a structure which may be used to aid in the construction of subsequently formed components, such as vertical transistors, pMTJs, MOSFETs, CMOS control circuitry, etc., is shown according to one embodiment. The structure may be formed in accordance with the present invention in any of the environments depicted herein, among others not specifically described, in various approaches. Of course, more steps, layers, and/or structures may be utilized in the formation of any of the structures and/or layers thereof than those specifically described in FIGS. 3A-3E, as would be understood by one of skill in the art upon reading the present descriptions.

In FIGS. 3A-3E, two directions are shown, with the x-direction being an element width direction 304 and the y-direction being a film thickness direction 302. The z-direction is an element depth direction and is not shown, but may be visualized as being into the page.

Each of the intermediate structures shown in FIGS. 3A-3E may be formed by any suitable component of the operating environment. For example, in various embodiments, the structure(s) may be partially or entirely formed by a machine, controller, processing circuit, or some other device or combination of devices suitable for manufacturing and/or processing a thin film structure. A processing circuit may include one or more processors, chips, and/or modules implemented in hardware and/or software, and preferably having at least one hardware component, and may be utilized in any device to form one or more structures or layer thereof. Illustrative processing circuits include, but are not limited to, a central processing unit (CPU), an application specific integrated circuit (ASIC), a field programmable gate array (FPGA), etc., combinations thereof, or any other suitable computing device known in the art.

In the descriptions of FIGS. 3A-3E, each layer may be formed using any known deposition process, such as sputtering, plating, chemical vapor deposition (CVD), plasma chemical vapor deposition (pCVD), physical vapor deposition (PVD), molecular beam epitaxy (MBE), atomic layer deposition (ALD), etc. Moreover, any descriptions of removal of layers and/or material may be performed using any material removal process of a type known in the art, such as planarization, chemical mechanical polishing (CMP), recess etching, reactive ion etching (RIE), ion milling, plasma etching, photolithography, etc.

Figure 3A:
FIGS. 3A-3E show various structures created during manufacture of a structure which may be used to aid in the construction of subsequently formed components according to one embodiment.

As shown in FIG. 3A, ions are implanted into a donor substrate 306 to a peak implant position 308 located below an upper surface of the substrate in the film thickness direction 302, the donor substrate 306 comprising a majority of Si. The position of the peak implant position 308 is selected to provide a sufficient thickness of donor substrate 306 to remain above the peak implant position 308 once the donor substrate 306 is cleaved (at the peak implant position 308) in a subsequent operation. The depth of the peak implant position 308 in the film thickness direction 302 is controllable via implantation angle and/or beam energy used to implant the ions, in various approaches.

According to various approaches, the Si wafer of the donor substrate 306 may be tilted at an angle that is in a range from about 0° to about 15° relative to the incident beam depending on a configuration of the implanter device. In many embodiments, an angle of about 7° may be used for the Si(100) surface due the channeling effect. With the channeling effect, lattice damage created by the incident beam is minimized and concentration deviation from peak concentration in the vertical direction is minimized, which are both desirable outcomes. Moreover, for the beam energy, the ions may be controlled in a range from about 100 keV to about 200 keV, such as about 180 keV for boron implantation to achieve a peak concentration at about 100 nm below the Si surface. Again, these parameters may be controlled depending on the ions implanted, the desired depth of the peak implant position 308, the material of the donor substrate 306, etc.

In one embodiment, the donor substrate 306 may comprise a monocrystalline Si wafer, while the ions may comprise $H^+$ and/or $B^+$. In a further embodiment, the ions may be implanted into the crystalline Si donor substrate 306 at a well-defined depth consistent with the peak implant position 308 by stringently controlling the incident energy of the ions at about 150 keV and dose at about $1.10^{16}$ cm$^{-2}$.

Figure 3B:
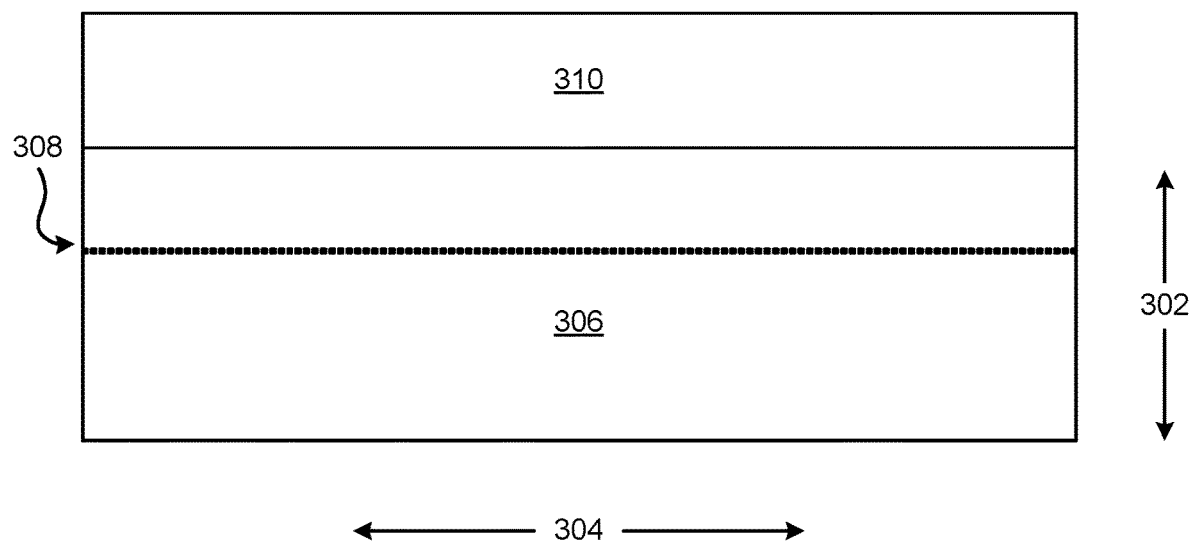

Now referring to FIG. 3B, a dielectric layer 310 is formed above the donor substrate 306 in the film thickness direction 302. The dielectric layer 310 may comprise any suitable dielectric material known in the art, such as $SiO_2$, SiON, $ZrO_2$, $HfO_2$, $Al_2O_3$, etc. In one embodiment, the dielectric layer may include $SiO_2$.

Figure 3C:
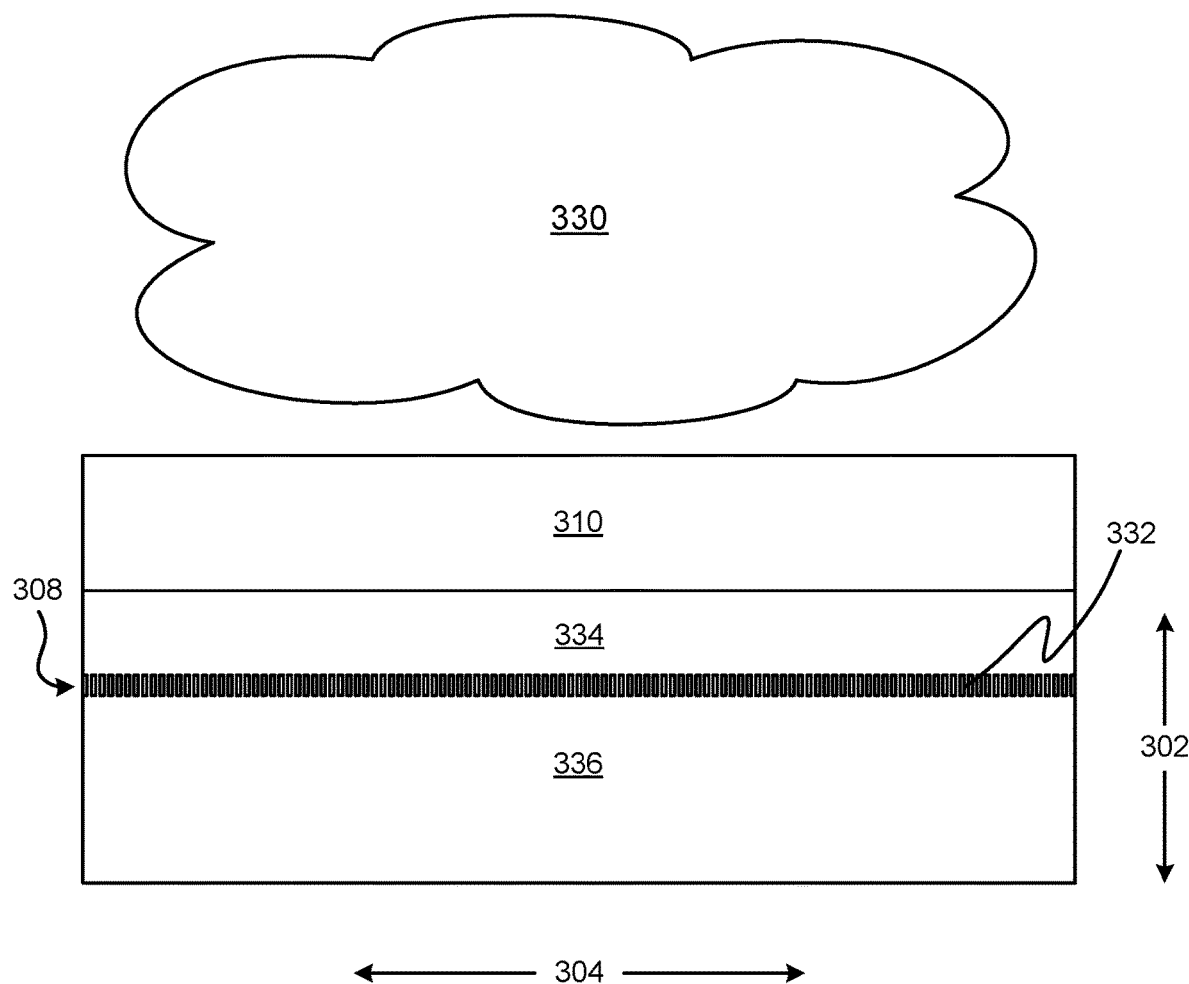

With reference to FIG. 3C, the donor substrate 306 and dielectric layer 310 are annealed in an inert environment 330 to form blisters 332 at the peak implant position 308. The annealing temperature may be limited to a temperature of about 350° C. or less.

The inert environment may comprise $N_2$ or some other suitable inert gas or gases.

In one approach, the implanted ions capture electrons to form atoms, which in turn form into a diatomic gas based on the implanted ions (for $B^+$ ions, the gas is $B_2$, for $H^+$ ions, the gas is $H_2$, etc.). Heat treating the implanted donor substrate 306 at a temperature about 500° C. forms a layer of microbubbles at the peak implant position 308, which is parallel to a cleaving plane of the donor substrate 306, without causing a wafer of the donor substrate 306 to split. This heat treatment may be performed during the ion implantation, or may be performed as a separate step after the ion implantation during a separate annealing operation, depending on the temperature of the donor substrate 306 during implantation, among other factors. When the donor substrate 306 is heated above about 500° C., gas pressure builds within the peak implant position 308, and the donor substrate 306 will cleave into two portions along the cleavage plane. It is believed this separation occurs because a crystalline rearrangement and coalescence of the microbubbles occurs to form macrobubbles with sufficient kinetics to separate the portions of the donor substrate 306. However, the addition of $B^+$ ions lowers the temperature that is required to form the blisters 332 due to higher implantation damage with the addition of the $B^+$ ions, thereby allowing for the cleaving to occur without damaging other structures or layers located near the donor substrate 306 due to a high temperature.

In addition, implanting $B^+$ enables tighter control of a vertical concentration deviation of $H^+$. Pre-implanted $B^+$ ions will forms cluster sites with subsequently implanted $H^+$ ions. Given that heavier atoms (e.g., B atoms versus H atoms) are much easier to implant into a desired localized vertical area, using a pre-implanted $B^+$ concentration enables tighter control of the $H^+$ concentration in the vertical direction (i.e., the film thickness direction 302).

Then, due to the annealing temperature and formation of the blisters 332, an upper portion 334 of the donor substrate (which includes the dielectric layer 310 thereon) is cleaved from a lower portion 336 of the donor substrate using the blisters 332 as a cleaving plane at the peak implant position 308 through the donor substrate.

In another embodiment, at least one pMTJ may be formed above the dielectric layer 310 in the film thickness direction 302 prior to cleaving the donor substrate into the upper portion 334 and the lower portion 336. In this embodiment, the at least one pMTJ is formed at a temperature of about 300° C. or less to prevent formation of blisters at the peak implant position 308.

In another embodiment, a CMOS+MRAM structure may be processed on the upper portion 334 either after the thermal treatment step (using $H^+$) or before using $B^+$ since the latter treatment may be performed at lower temperatures compatible with the magnetics of CMOS+MRAM structures. The CMOS layer may be processed directly on the native Si of the substrate without the prior formation of the dielectric layer 310. This structure may then be bonded to another MRAM wafer at a low temperature using their top dielectric passivation layer as the bonding layer.

Figure 3D:
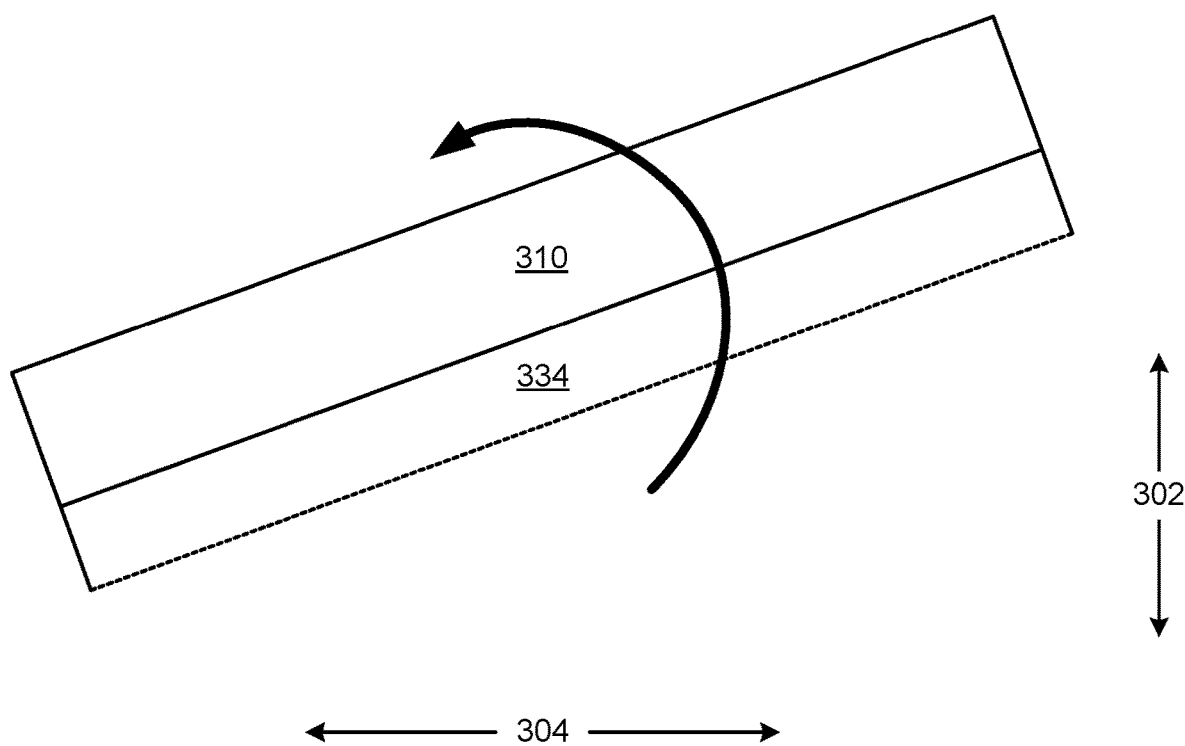

Now referring to FIG. 3D, a structure that comprises the upper portion 334 of the donor substrate and the dielectric layer 310 is flipped 180° about an axis normal to the film thickness direction 302.

Figure 3E:
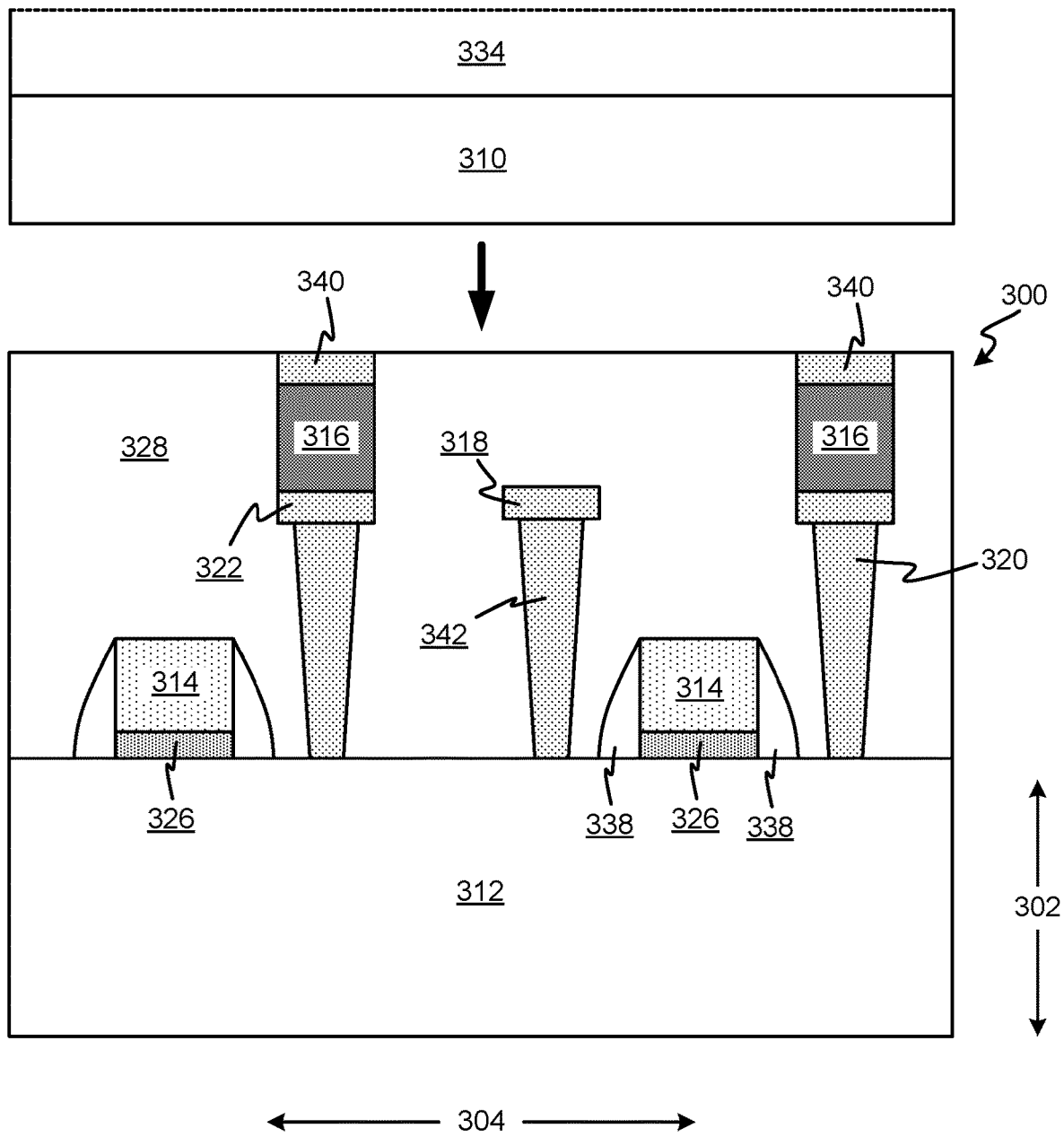

After the structure is flipped, the dielectric layer 310 may be bonded to an upper surface of a semiconductor structure 300 as shown in FIG. 3E. This bonding operation takes place at a temperature of about 350° C. or less, in order to ensure that components of the semiconductor structure 300 are not damaged during the bonding process.

The bonding process may include a dry surface plasma activation process and a thermal treatment process which works to create a bond between the dielectric layer 310 and the upper surface of the semiconductor structure 300 (preferably also an oxide layer). This thermal bonding process depends on the specific surfaces involved, but may be performed at less than about 400° C., which is a temperature that is compatible with the allowable thermal envelope of MRAM stacks, including MOSFETs, pMTJs, and other such structures.

Furthermore since metal bonding is capable of being performed at lower energy, a metal/dielectric fill may be patterned on both sides of the bonding surfaces and polished prior to bonding, according to another embodiment. This approach may provide strong wafer bonding with lower thermal processing temperatures of less than about 350° C., thereby preserving a thermal budget while limiting lateral shorting paths due to the inclusion of a dielectric material in the fill structure. Finally, by performing this bonding step using a localized laser anneal technique, the thermal stress on the magnetics may be reduced further.

As shown in FIG. 3E, the semiconductor structure 300 includes a base substrate 312, two gate layers 314 separated from the base substrate 312 by gate dielectric layers 326, spacer layers 338 around the gate layers 314, a source line 318 coupled to a source channel 342, and channels 320 connecting a source terminal 322 to a pMTJ 316, and bit lines 340. The structures are encased in a dielectric layer 328.

In one such embodiment, each pMTJ 316 may comprise a seed layer, an underlayer positioned above the seed layer, a synthetic antiferromagnetic (SAF) seed layer positioned above the underlayer, a first SAF layer positioned above the SAF seed layer, a spacer layer positioned above the first SAF layer, an antiferromagnetic (AFM) coupling layer positioned above the spacer layer, a second SAF layer positioned above the AFM coupling layer, a ferromagnetic (FM) coupling layer positioned above the second SAF layer, a reference layer that comprises a first reference layer positioned below a second reference layer, a barrier layer positioned above the reference layer, a free layer which includes a lower free layer positioned above the barrier layer, a middle free layer positioned above the lower free layer, and an upper free layer positioned above the middle free layer. Each pMTJ 316 may also comprise a first cap layer positioned above the upper free layer, a second cap layer positioned above the first cap layer, a third cap layer positioned above the second cap layer, and a fourth cap layer positioned above the third cap layer.

In one embodiment, the bonding layer (which includes portions of the dielectric layers 310, 328 may include $Si_3N_4$ and/or TiN to enable better bonding adhesion of the contacted surfaces.

In a further embodiment, an exposed surface of the upper portion 334 of the donor substrate may be planarized to smooth the surface, a second dielectric layer may be formed above the exposed surface of the upper portion 334 of the donor substrate in the film thickness direction 302, and a second semiconductor structure may be formed above the second dielectric layer in the film thickness direction 302. However, during all of this processing, the second semiconductor structure is formed at a temperature of about 300° C. or less.

Following the bonding operation in one approach, the upper portion 334 may be peeled off mechanically and the remnant part of the bonded epitaxial Si may be polished down to a desired thickness. At the end of this process, the structure includes a first MRAM layer encapsulated with a dielectric and topped off by an Epi-Si layer supporting the needs for a next level of memory. Hence, in subsequent steps, this process may be repeated several times to build a 3D memory architecture by repeating the CMOS layer and magnetic memory stack processes followed by multiple wafer bonding steps, as described herein in various embodiments.

Now referring to FIGS. 4A-4E, formation of a structure which may be used to aid in the construction of subsequently formed components, such as vertical transistors, pMTJs, MOSFETs, CMOS control circuitry, etc., is shown according to one embodiment. The structure may be formed in accordance with the present invention in any of the environments depicted herein, among others not specifically described, in various approaches. Of course, more steps, layers, and/or structures may be utilized in the formation of any of the structures and/or layers thereof than those specifically described in FIGS. 4A-4E, as would be understood by one of skill in the art upon reading the present descriptions.

In FIGS. 4A-4E, two directions are shown, with the x-direction being an element width direction 404 and the y-direction being a film thickness direction 402. The z-direction is an element depth direction and is not shown, but may be visualized as being into the page.

Each of the intermediate structures shown in FIGS. 4A-4E may be formed by any suitable component of the operating environment. For example, in various embodiments, the structure(s) may be partially or entirely formed by a machine, controller, processing circuit, or some other device or combination of devices suitable for manufacturing and/or processing a thin film structure. A processing circuit may include one or more processors, chips, and/or modules implemented in hardware and/or software, and preferably having at least one hardware component, and may be utilized in any device to form one or more structures or layer thereof. Illustrative processing circuits include, but are not limited to, a CPU, an ASIC, a FPGA, etc., combinations thereof, or any other suitable computing device known in the art.

In the descriptions of FIGS. 4A-4E, each layer may be formed using any known deposition process, such as sputtering, plating, CVD, pCVD, PVD, MBE, ALD, etc. Moreover, any descriptions of removal of layers and/or material may be performed using any material removal process of a type known in the art, such as planarization, CMP, recess etching, RIE, ion milling, plasma etching, photolithography, etc.

Figure 4A:
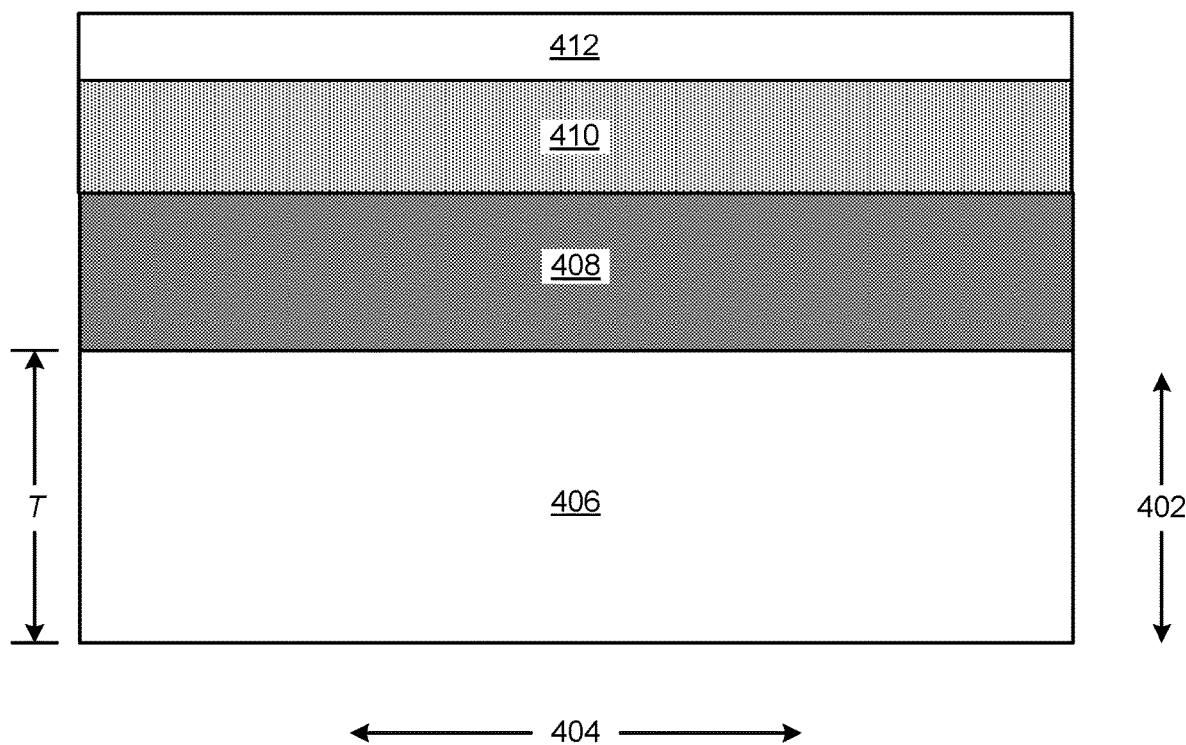
FIGS. 4A-4E show various structures created during manufacture of a structure which may be used to aid in the construction of subsequently formed components according to one embodiment.

As shown in FIG. 4A, a sacrificial buffer layer 408 is formed above a donor substrate 406 in the film thickness direction 402, the donor substrate 406 comprising a majority of Si. A strained Si layer 410 is formed above the sacrificial buffer layer 408 in the film thickness direction 402, followed by formation of a dielectric layer 412 above the strained Si layer 410 in the film thickness direction 402. The donor substrate 406 has a thickness of T in the film thickness direction 402 at the beginning of this procedure.

In one embodiment, the substrate may comprise a monocrystalline Si wafer, the sacrificial buffer layer may comprise SiGe, and the dielectric layer may comprise $SiO_2$. Any other suitable material known in the art may be used in place of or in addition to any of the above described materials, as would be apparent to one of skill in the art.

Figure 4B:
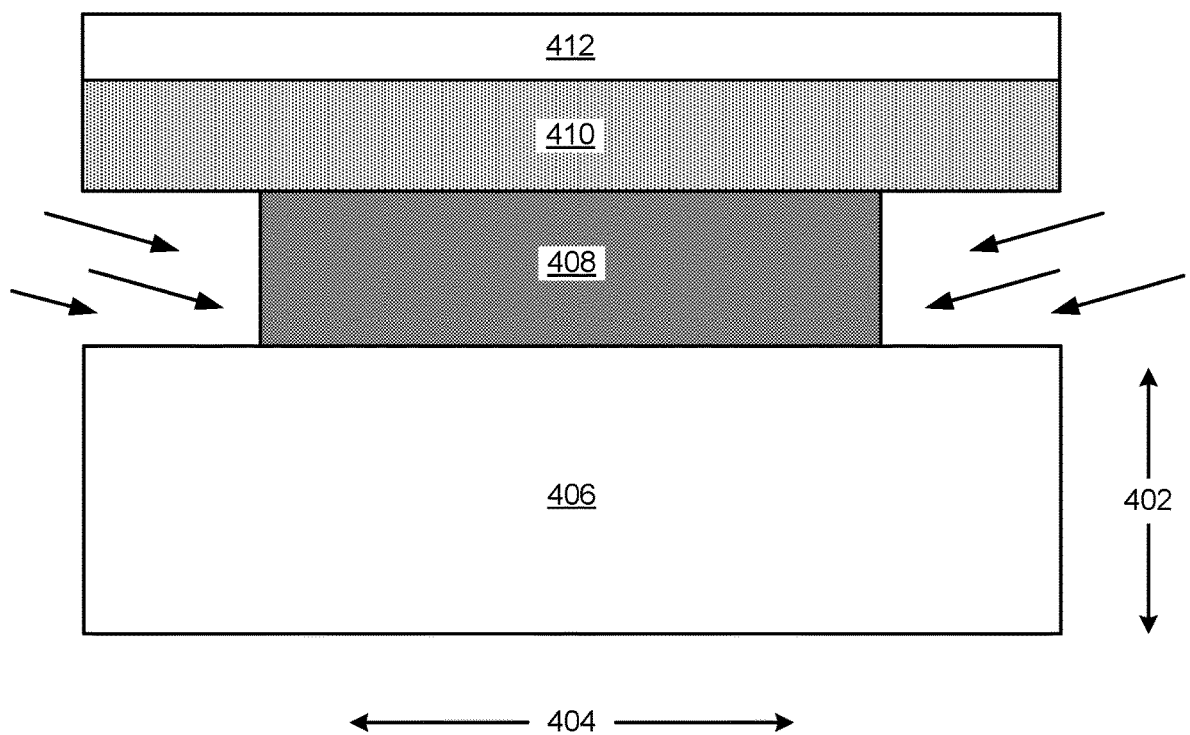

As shown in FIG. 4B, the sacrificial buffer layer 408 is etched away using any known etching method known in the art, without removing any portion of any of the other layers.

Figure 4C:
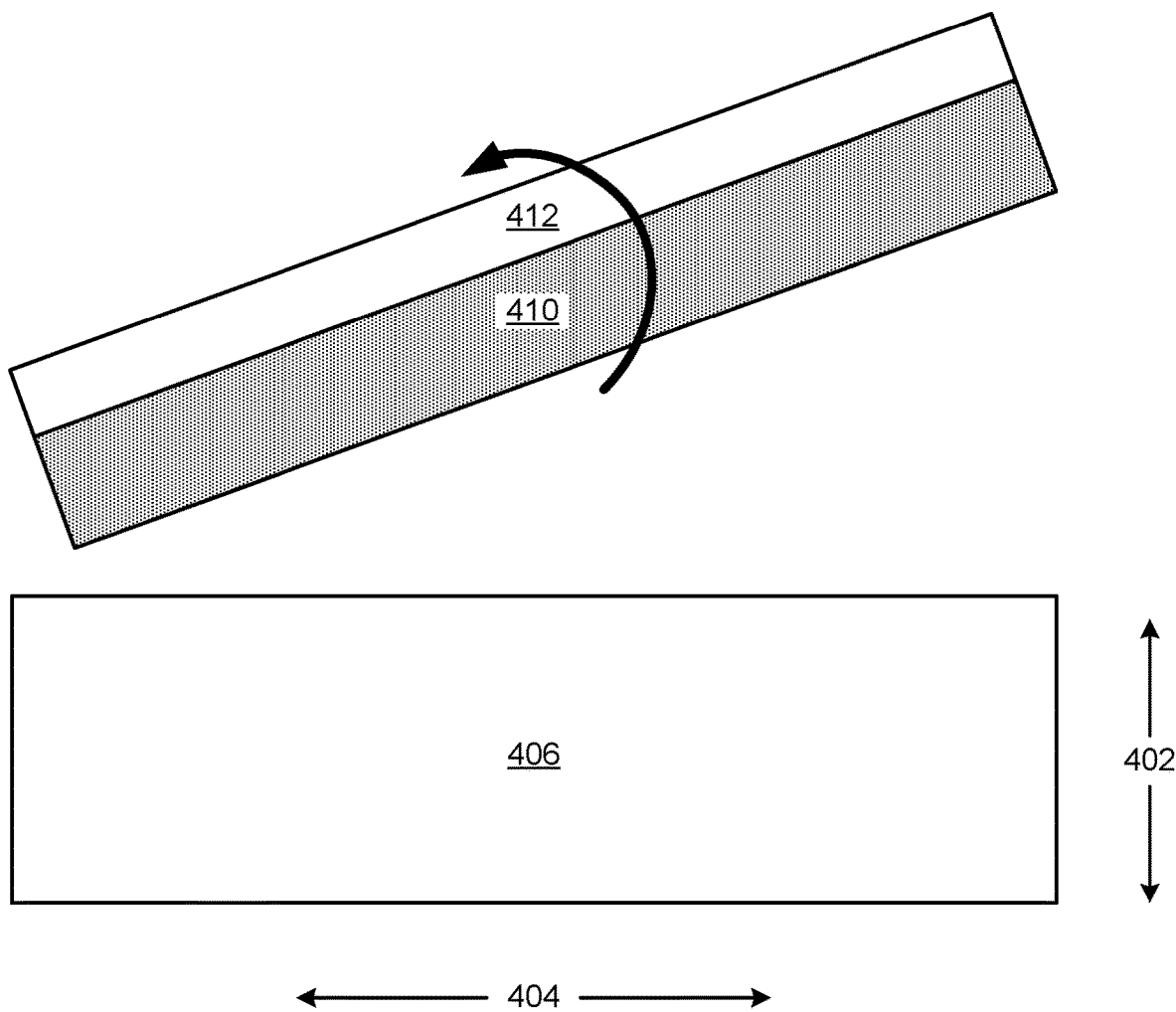

With reference to FIG. 4C, a structure that comprises the strained Si layer 410 and the dielectric layer 412 is flipped 180° about an axis normal to the film thickness direction 402.

Figure 4D:
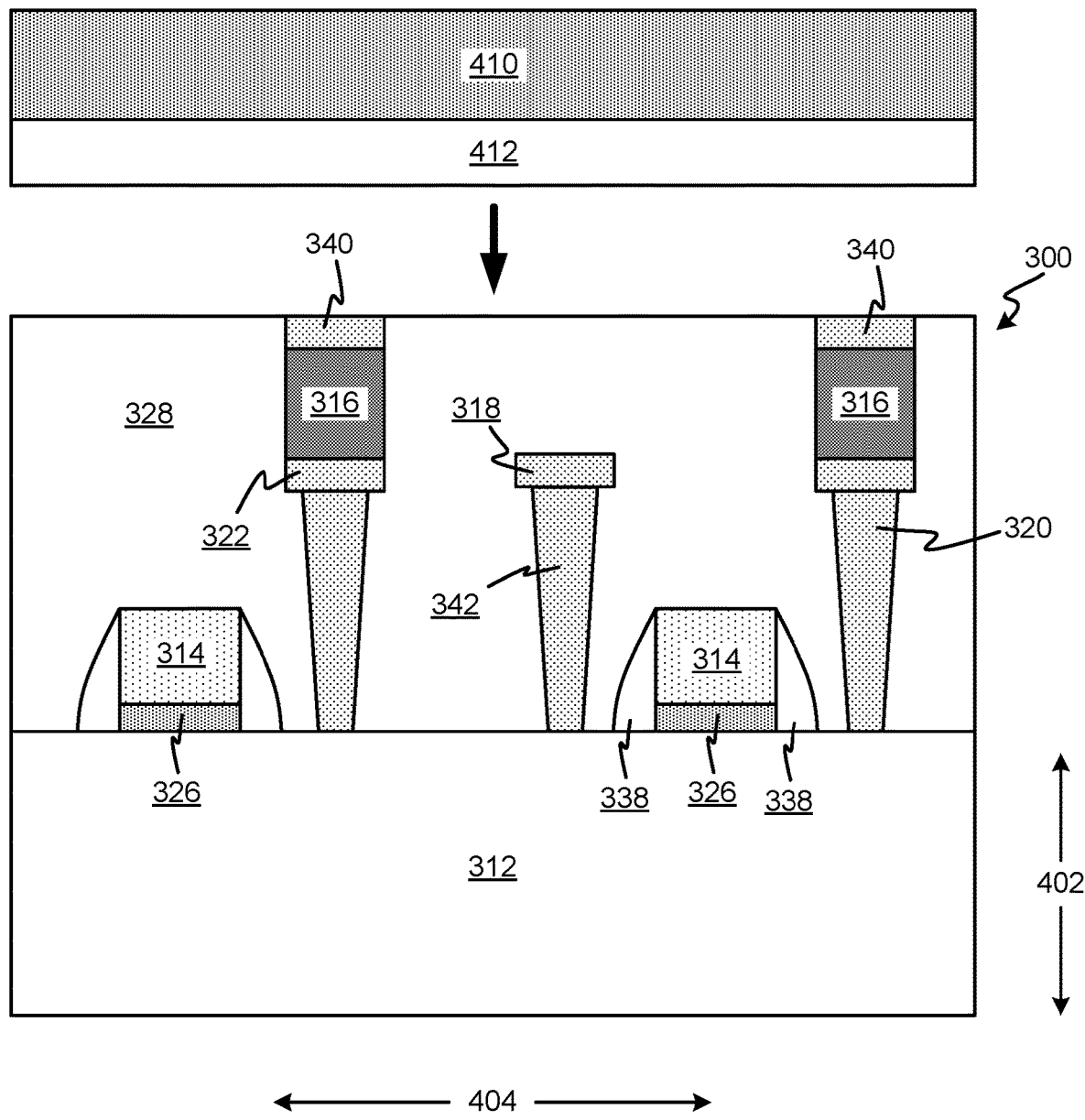

Then, as shown in FIG. 4D, the dielectric layer 412 is bonded to an upper surface of a semiconductor structure 300 at a temperature of about 350° C. or less to prevent damage to any of the components of the semiconductor structure 300. In one approach, the semiconductor structure may include a MRAM wafer.

In a further embodiment, a second dielectric layer may be formed above the strained Si layer 410 in the film thickness direction 402 and a second semiconductor structure may be formed above the second dielectric layer in the film thickness direction 402. The second semiconductor structure is formed at a temperature of about 300° C. or less to prevent damage to any of the components of the second semiconductor structure.

Figure 4E:
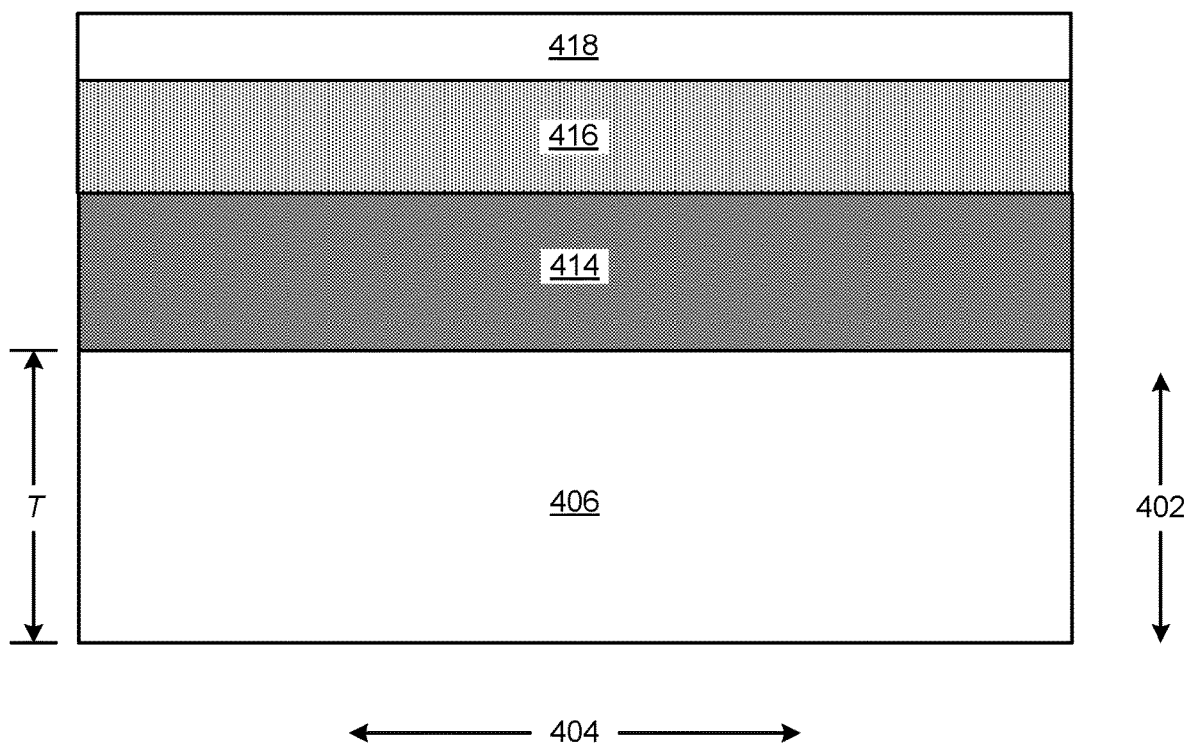

As shown in FIG. 4E, the donor substrate may be reused to form additional sacrificial buffer layer 414/strained Si layer 416/dielectric layer 418 structures above the donor substrate 406 in the film thickness direction 402. It is noted that the reused donor substrate 406 still has a thickness of T after use to produce the first buffer layer/strained Si layer/dielectric layer structure.

In this embodiment, unlike the cleavable substrate formed in FIGS. 3A-3E using ion implantation, the cleavable substrate of FIGS. 4A-4E is formed without ion implantation, by depositing a thick sacrificial epitaxial Ge layer (having a thickness of about 1000 nm in the film thickness direction 402) on top of the crystalline Si substrate 406. Subsequently, another Epi-Si layer is grown and thermal oxide or PECVD oxide is formed above the Ge layer. In one embodiment, the Epi-Si layer may be strained to provide higher field effective mobility. Subsequently, the sacrificial Ge layer may be removed by a selective wet etch technique. This approach imparts less strain on the underlying semiconductor structure during the mechanical cleaving step and is potentially be more compatible with lower bonding energies between the wafer structures.

With reference to FIGS. 5A-5G, another manufacturing process is shown according to one embodiment. Now referring to FIG. 5A, ions are implanted into a donor substrate 306 to a peak implant position 308 located below an upper surface of the substrate in the film thickness direction 302, the donor substrate 306 comprising a majority of Si.

In one embodiment, the donor substrate 306 may comprise a monocrystalline Si wafer, while the ions may comprise $H^+$ and/or $B^+$. In a further embodiment, the ions may be implanted into the crystalline Si donor substrate 306 at a well-defined depth consistent with the peak implant position 308 by stringently controlling the incident energy of the ions at about 150 keV and dose at about $1.10^{16}$ $cm^{-2}$.

Figure 5A:
FIGS. 5A-5G show various structures created during manufacture of a structure which may be used to aid in the construction of subsequently formed components according to one embodiment.
Figure 5B:
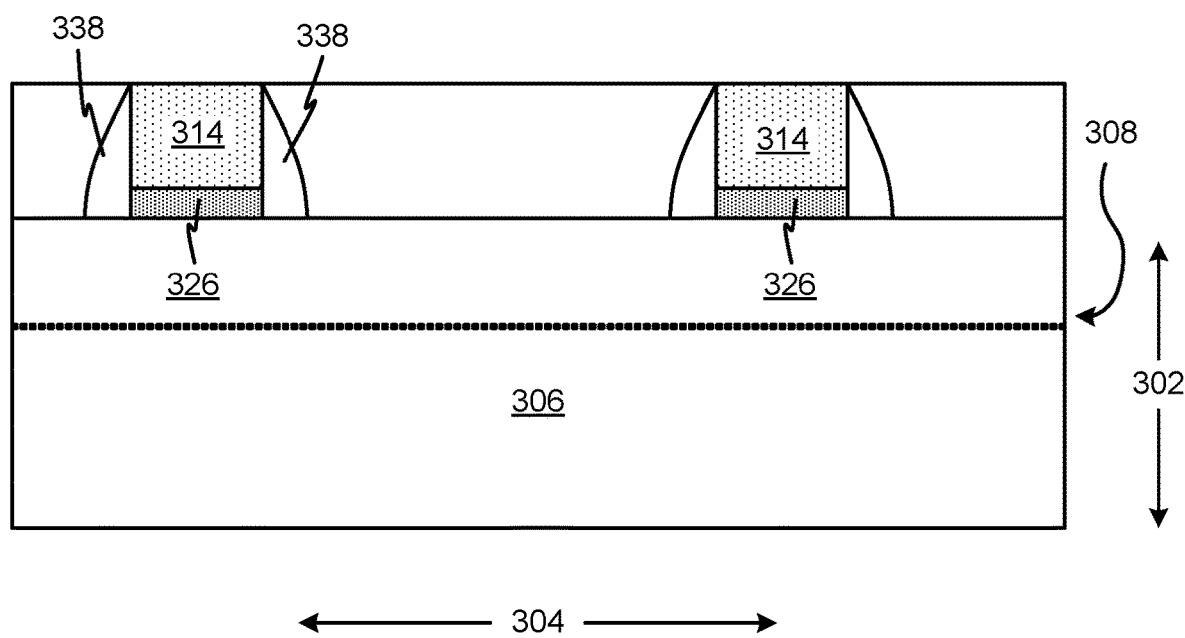

Now referring to FIG. 5B, gate dielectric layers 326 are formed above the substrate 306, and two gate layers 314 are formed above the gate dielectric layers 326 separated from the substrate 306. Spacer layers 338 are formed around the gate layers 314, as well. All of these structures are formed at a temperature of less than about 300° C. in this embodiment. The transistors formed above the substrate 306 may be junctionless transistors, Schottky transistors, etc., where junction activation is not required for low temperature processing.

Figure 5C:
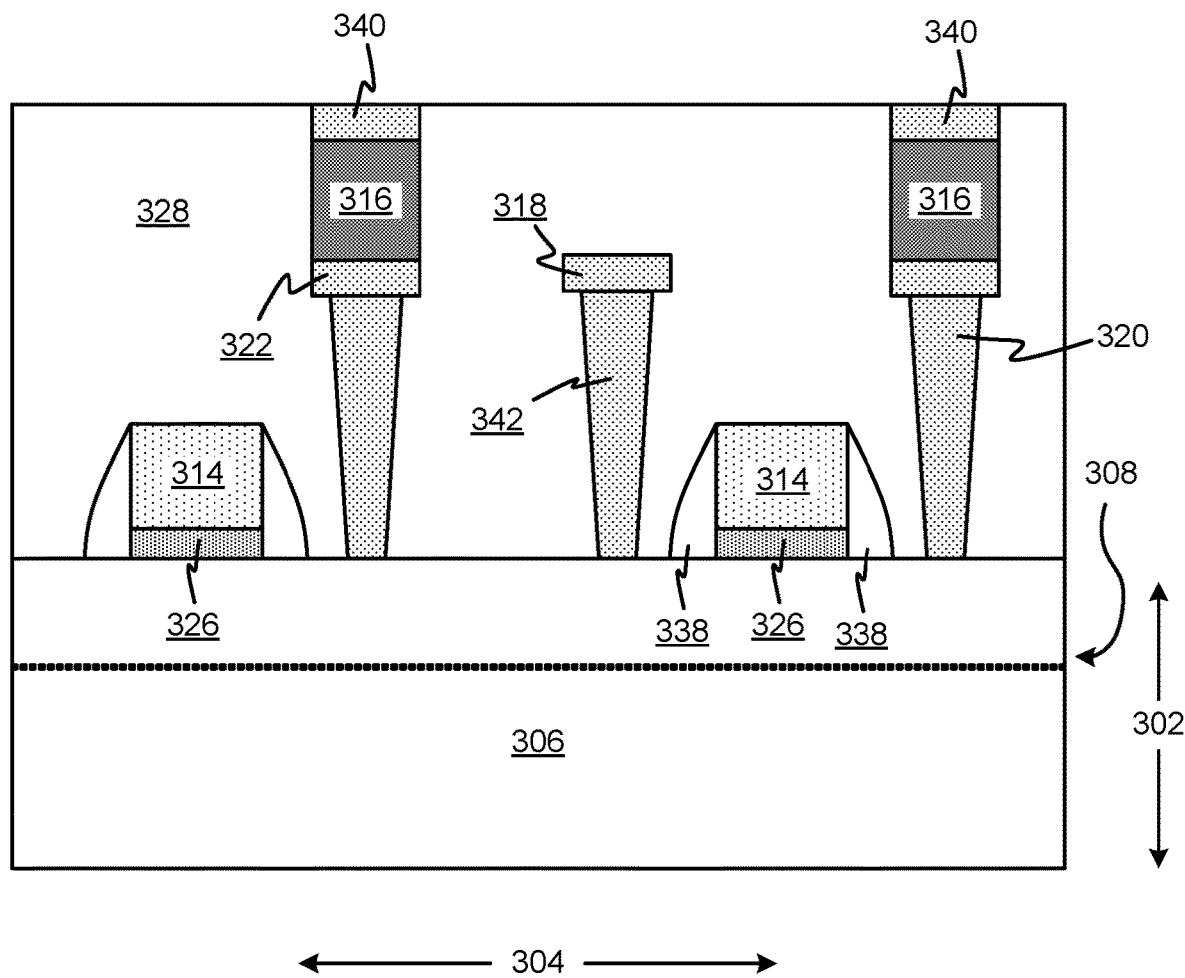

With reference to FIG. 5C, a source line 318 coupled to a source channel 342 are formed, and channels 320 connecting a source terminal 322 to a pMTJ 316 are formed, along with bit lines 340. The structures are encased in a dielectric layer 328. All of these structures are formed at a temperature of less than about 300° C. in this embodiment.

Figure 5D:
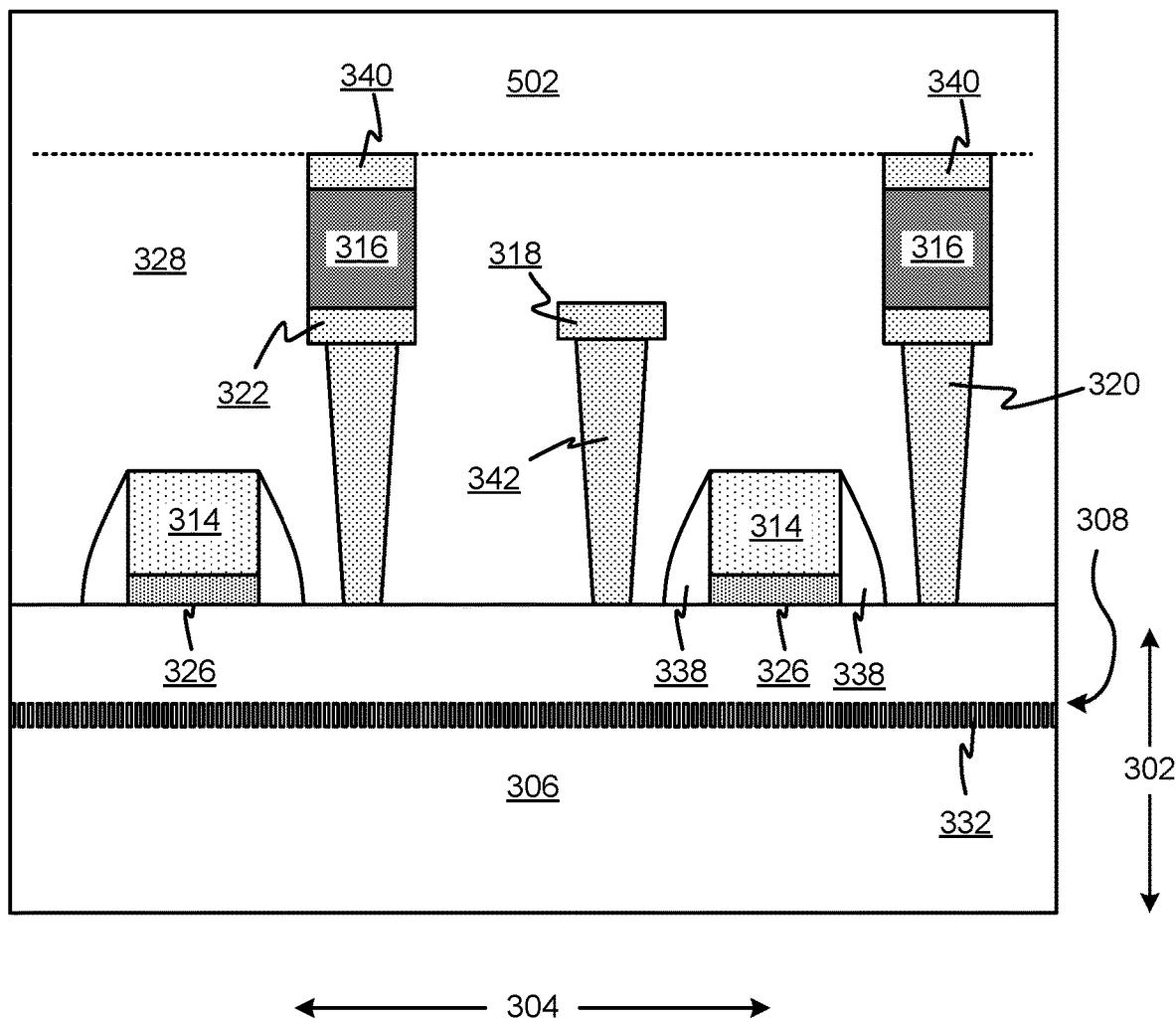

Referring to FIG. 5D, additional dielectric material 502 is deposited above the existing structure in the film thickness direction 302. Moreover, the structure is annealed in an inert environment to form blisters 332 at the peak implant position 308. The annealing temperature may be limited to a temperature of about 350° C. or less. The inert environment may comprise $N_2$ or some other suitable inert gas or gases.

Figure 5E:
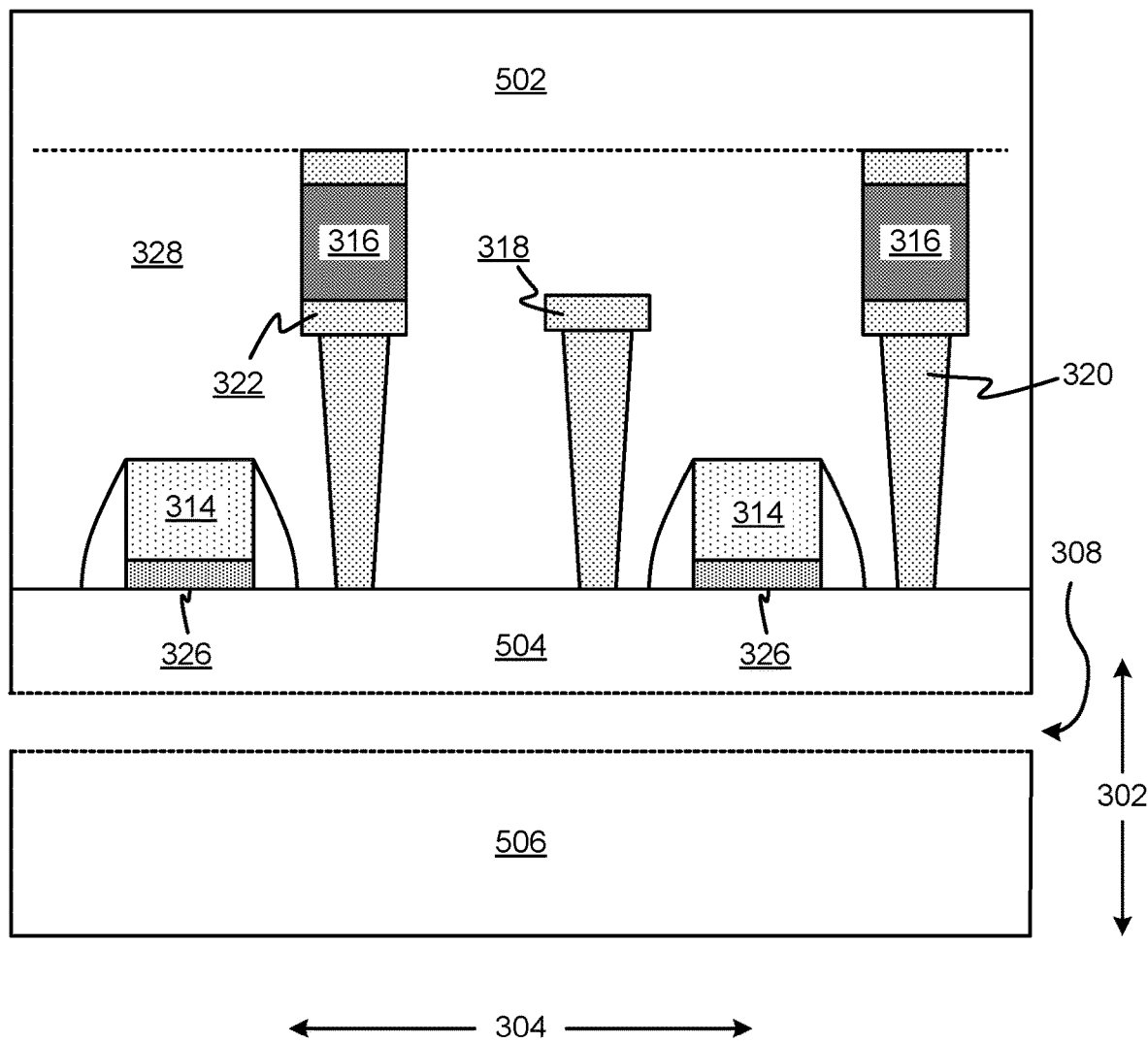

With reference to FIG. 5E, due to the annealing temperature and formation of the blisters, an upper portion 504 of the donor substrate is cleaved from a lower portion 506 of the donor substrate using the blisters as a cleaving plane at the peak implant position 308 through the donor substrate.

Figure 5F:
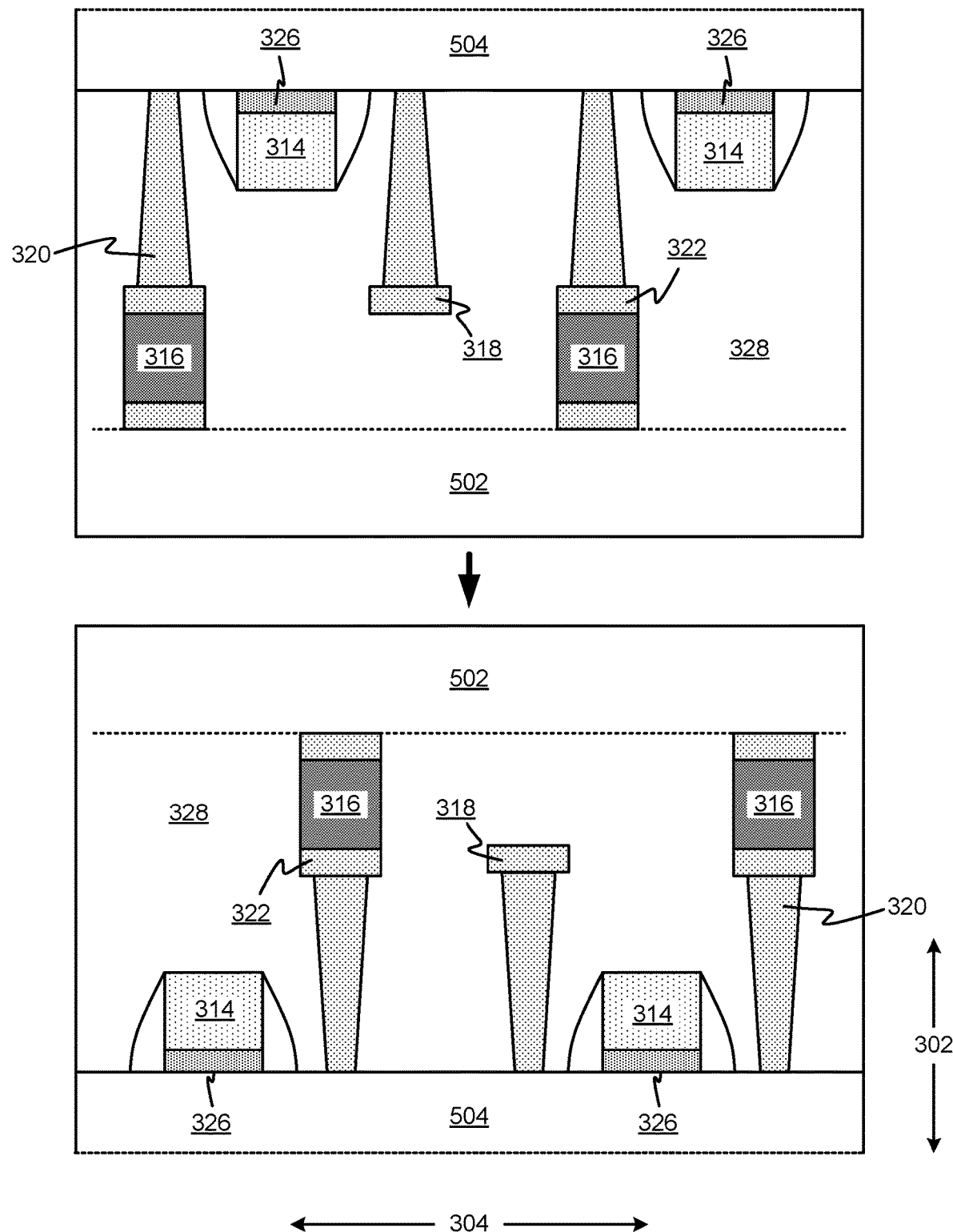
Figure 5G:
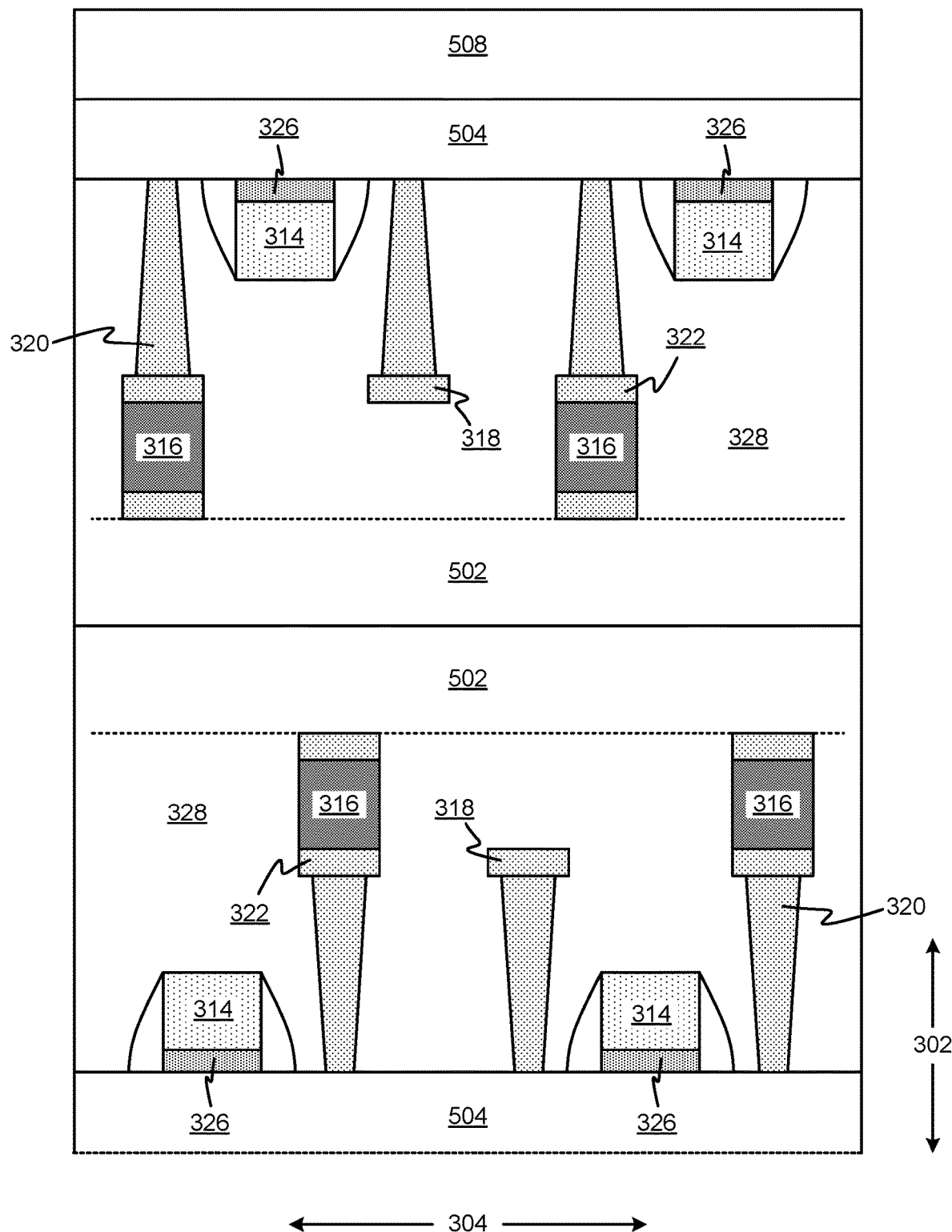

As shown in FIG. 5F, this structure may be flipped 180° about an axis normal to the film thickness direction 302 and bonded to another similar structure in an inverted position as shown in FIG. 5G. The bonding process may include a dry surface plasma activation process and a thermal treatment process which works to create a bond between the two dielectric layers 502 (preferably formed of an oxide material). This thermal bonding process depends on the specific surfaces involved, but may be performed at less than about 400° C., which is a temperature that is compatible with the allowable thermal envelope of MRAM stacks, including MOSFETs, pMTJs, and other such structures.

Figure 6A:
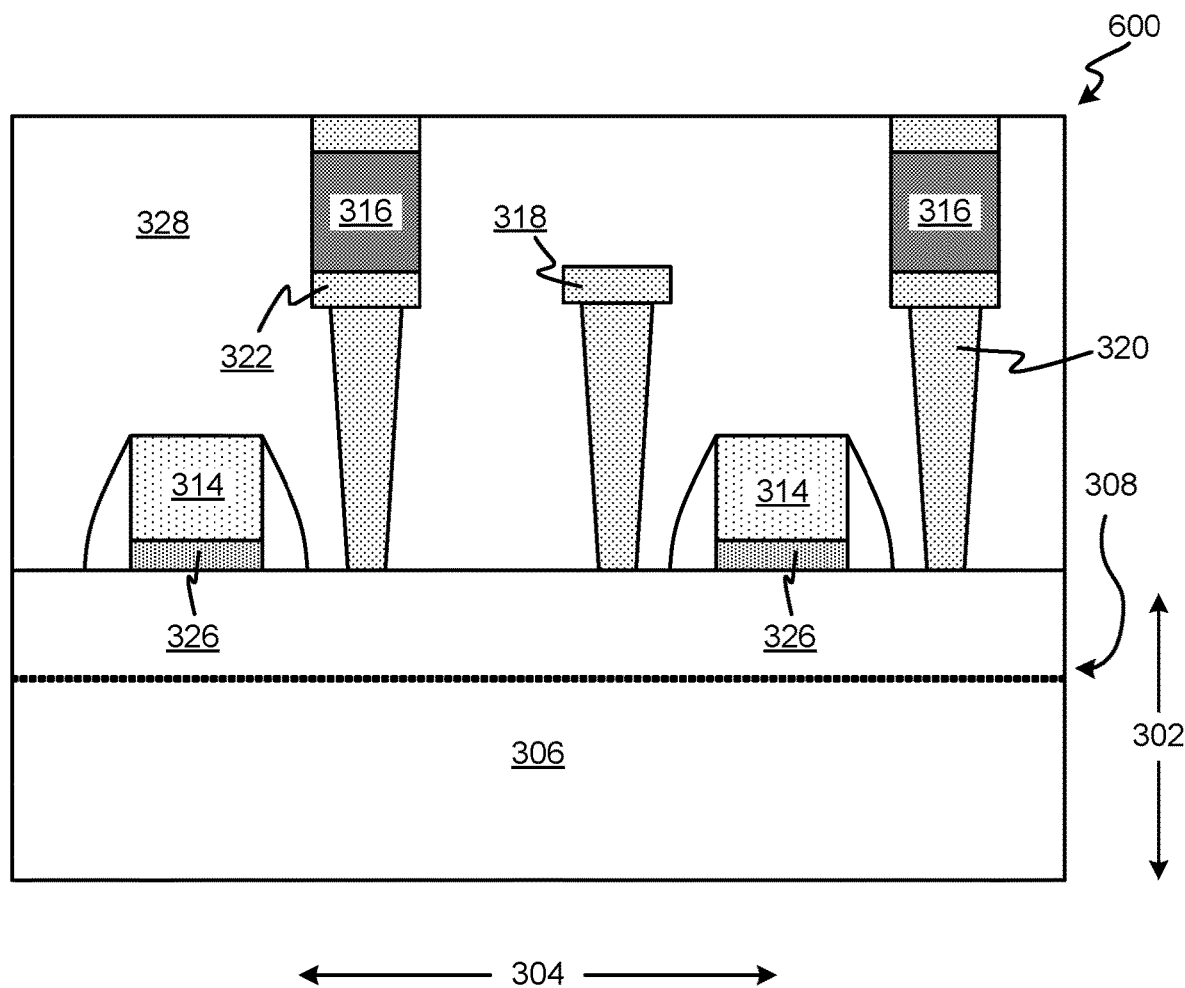
FIGS. 6A-6B show various structures created during manufacture of a structure with bonding pads according to one embodiment.
Figure 6B:
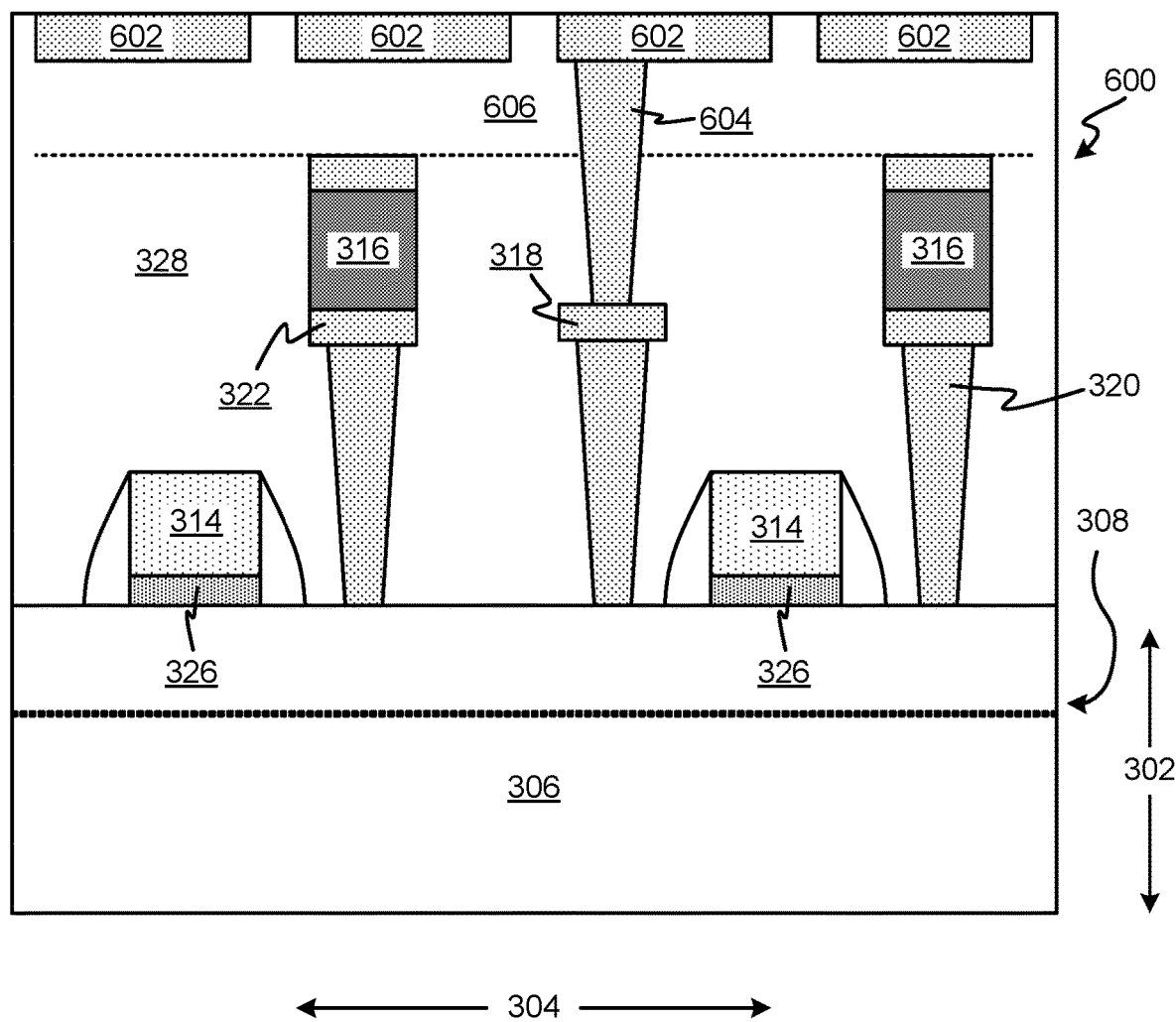

With reference to FIGS. 6A-6B, bonding pads 602 (some of which may not be functional for connections thereto) may be formed above an upper dielectric layer 606 positioned above the semiconductor structure 600, along with formation of a channel 604 to couple the source line 318 to one of the bonding pads 602. In this way, uniform bonding and good mechanical stability is provided to the structure and any subsequently formed structures thereon.

The embodiments described herein allow for the formation of an MRAM with higher density and capacity than a traditional 2D MRAM integration scheme, potentially opening up the DRAM space where a combination of speed and density is a must while providing lower power dissipation.

One of the advantages of this stacking methodology as opposed to stacking dies during chip packaging (typically limited to 16 layers) is the possibility to stack many more levels of memory on top of one another. The only limitation is the thermal budget of the magnetic stack and the bonding energy at the dielectric-to-dielectric interface.

The use of the sacrificial Ge layer imposes less strain on the magnetics wafer, potentially allowing more layers to be stacked on top of each other. Furthermore, the Ge growth method allows reuse of the same sacrificial wafer many times over, as opposed to the method involving an ion implantation in the donor substrate which is limited by the remaining thickness of the lower portion of the donor substrate.

Moreover, it is possible to use Ta/W/Ta diffusion barrier layer set to couple the SAF to the reference layer and provide a barrier for Ta and B diffusion, thereby making the stacks stable to 425° C.

Figure 7:
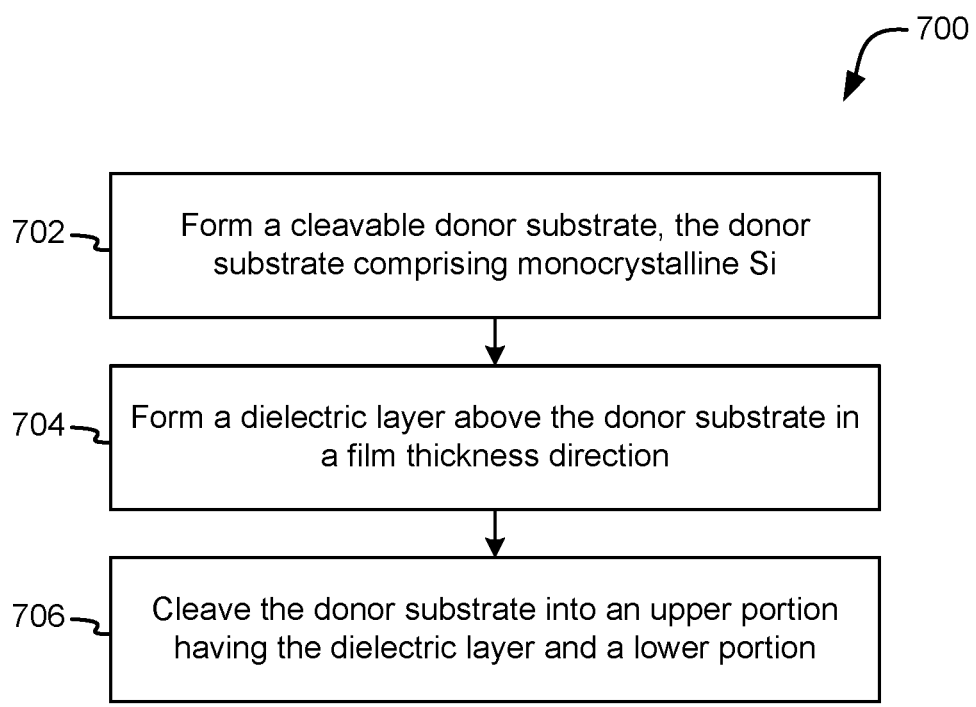
FIG. 7 shows a flow diagram of a method according to one embodiment.

Now referring to FIG. 7, a method 700 is shown according to one embodiment. The method 700 may be performed in accordance with the present invention in any of the environments depicted in FIGS. 1-6B, among others not specifically described, in various approaches. Of course, more or less operations than those specifically described in FIG. 7 may be included in method 700, as would be understood by one of skill in the art upon reading the present descriptions.

Each of the operations of method 700 may be performed by any suitable component of the operating environment. For example, in various embodiments, method 700 may be partially or entirely performed by a machine, controller, processing circuit, or some other device or combination of devices suitable for manufacturing and/or processing a thin film structure. A processing circuit may include one or more processors, chips, and/or modules implemented in hardware and/or software, and preferably having at least one hardware component, and may be utilized in any device to perform one or more operations of method 700. Illustrative processing circuits include, but are not limited to, a CPU, an ASIC, a FPGA, etc., combinations thereof, or any other suitable computing device known in the art.

In the descriptions of method 700, each layer may be formed using any known deposition process, such as sputtering, plating, CVD, pCVD, PVD, MBE, ALD, etc. Moreover, any descriptions of removal of layers and/or material may be performed using any material removal process of a type known in the art, such as planarization, CMP, recess etching, RIE, ion milling, plasma etching, photolithography, etc.

Method 700 may begin with operation 702, where a cleavable donor substrate is formed. The donor substrate comprises monocrystalline Si.

According to one approach, forming the cleavable donor substrate may include implanting ions into the donor substrate to a peak implant position located below an upper surface of the donor substrate in a film thickness direction and annealing the donor substrate and dielectric layer in an inert environment to form blisters at the peak implant position. In this approach, the donor substrate is cleaved using the blisters formed at the peak implant position, with the dielectric layer comprising $SiO_2$, and the inert environment comprising $N_2$.

In an alternate embodiment, forming the cleavable donor substrate may include forming a sacrificial buffer layer above the donor substrate in the film thickness direction and forming a strained Si layer above the sacrificial buffer layer and below the dielectric layer in the film thickness direction. In this embodiment, the donor substrate is cleaved by etching away the sacrificial buffer layer, with the proviso that no other layer is removed. The sacrificial buffer layer includes Ge and/or SiGe, and the dielectric layer includes $SiO_2$.

In operation 704, a dielectric layer is formed above the donor substrate in a film thickness direction. The dielectric layer may comprise any suitable material known in the art, such as $SiO_2$.

In operation 706, the donor substrate is cleaved into an upper portion having the dielectric layer and a lower portion.

Method 700 may also include flipping the upper portion and the dielectric layer 180° about an axis normal to the film thickness direction to invert the layers. Thereafter, the dielectric layer is bonded to an upper surface of a semiconductor structure at a temperature of about 350° C. or less in order to maintain integrity of the components of the semiconductor structure.

In another embodiment, method 700 may include planarizing an exposed surface of the upper portion of the donor substrate, forming a second dielectric layer above the exposed surface of the upper portion in the film thickness direction, and forming a second semiconductor structure above the second dielectric layer in the film thickness direction. The second semiconductor structure is formed at a temperature of about 300° C. or less to maintain the integrity of the magnetic components therein.

In yet another embodiment, method 700 may include forming at least one pMTJ above the dielectric layer in the film thickness direction prior to cleaving the donor substrate. In this embodiment, the at least one pMTJ is formed at a temperature of about 300° C. or less. Moreover, forming the at least one pMTJ may include any of all of the following: forming a seed layer above the dielectric layer in the film thickness direction, forming an underlayer above the seed layer in the film thickness direction, forming a SAF seed layer above the underlayer in the film thickness direction, forming a first SAF layer above the SAF seed layer in the film thickness direction, forming a spacer layer above the first SAF layer in the film thickness direction, forming an AFM coupling layer above the spacer layer in the film thickness direction, forming a second SAF layer above the AFM coupling layer in the film thickness direction, forming a FM coupling layer above the second SAF layer in the film thickness direction, forming a reference layer above the FM coupling layer in the film thickness direction, forming a barrier layer above the reference layer in the film thickness direction, forming a free layer above the barrier layer in the film thickness direction and forming at least one cap layer above the free layer in the film thickness direction.

While various embodiments have been described above, it should be understood that they have been presented by way of example only and not limitation. Other embodiments falling within the scope of the invention may also become apparent to those skilled in the art. Thus, the breadth and scope of the invention should not be limited by any of the above-described exemplary embodiments, but should be defined only in accordance with the following claims and their equivalents.

What is claimed is:

1. A method, comprising:
   implanting ions into a donor substrate to a peak implant position located below an upper surface of the donor substrate in a film thickness direction;
   forming a dielectric layer above the donor substrate in the film thickness direction;
   thermally annealing the donor substrate and dielectric layer by heating in an inert environment to form blisters at the peak implant position; and
   cleaving an upper portion of the donor substrate from a lower portion of the donor substrate using the blisters.

2. The method as recited in claim 1, further comprising:
   flipping a structure that comprises the upper portion of the donor substrate and the dielectric layer 180° about an axis normal to the film thickness direction; and
   bonding the dielectric layer to an upper surface of a semiconductor structure at a temperature of about 350° C. or less.

3. The method as recited in claim 2, further comprising:
   planarizing an exposed surface of the upper portion of the donor substrate;
   forming a second dielectric layer above the exposed surface of the upper portion of the donor substrate in the film thickness direction; and
   forming a second semiconductor structure above the second dielectric layer in the film thickness direction, wherein the second semiconductor structure is formed at a temperature of about 300° C. or less.

4. The method as recited in claim 1, further comprising:
   forming at least one perpendicular magnetic tunnel junction (pMTJ) above the dielectric layer in the film thickness direction prior to cleaving the donor substrate, wherein the at least one pMTJ is formed at a temperature of about 300° C. or less to prevent formation of blisters at the peak implant position.

5. The method as recited in claim 4, wherein forming the at least one pMTJ comprises:
   forming a seed layer above the dielectric layer in the film thickness direction;
   forming an underlayer above the seed layer in the film thickness direction;
   forming a synthetic antiferromagnetic (SAF) seed layer above the underlayer in the film thickness direction;
   forming a first SAF layer above the SAF seed layer in the film thickness direction;
   forming a spacer layer above the first SAF layer in the film thickness direction;
   forming an antiferromagnetic (AFM) coupling layer above the spacer layer in the film thickness direction;
   forming a second SAF layer above the AFM coupling layer in the film thickness direction;
   forming a ferromagnetic (FM) coupling layer above the second SAF layer in the film thickness direction;
   forming a reference layer above the FM coupling layer in the film thickness direction;
   forming a barrier layer above the reference layer in the film thickness direction;
   forming a free layer above the barrier layer in the film thickness direction; and
   forming at least one cap layer above the free layer in the film thickness direction.

6. The method as recited in claim 1,
   wherein the substrate is a monocrystalline Si wafer,
   wherein the dielectric layer comprises $SiO_2$, and
   wherein the inert environment comprises $N_2$.

7. A method, comprising:
   forming a cleavable donor substrate, the donor substrate comprising monocrystalline Si;
   forming a dielectric layer above the donor substrate in a film thickness direction; and
   cleaving the donor substrate into an upper portion having the dielectric layer and a lower portion; wherein forming the cleavable donor substrate comprises:
   implanting ions into the donor substrate to a peak implant position located below an upper surface of the donor substrate in a film thickness direction; and
   thermally annealing the donor substrate and dielectric layer by heating in an inert environment to form blisters at the peak implant position,
   wherein the donor substrate is cleaved using the blisters formed at the peak implant position, wherein the dielectric layer comprises $SiO_2$, and wherein the inert environment comprises $N_2$.

8. The method as recited in claim 7, further comprising:
   flipping the upper portion and the dielectric layer 180° about an axis normal to the film thickness direction; and bonding the dielectric layer to an upper surface of a semiconductor structure at a temperature of about 350° C. or less.

9. The method as recited in claim 8, further comprising:
planarizing an exposed surface of the upper portion of the donor substrate;
forming a second dielectric layer above the exposed surface of the upper portion in the film thickness direction; and
forming a second semiconductor structure above the second dielectric layer in the film thickness direction, wherein the second semiconductor structure is formed at a temperature of about 300° C. or less.

10. The method as recited in claim 7, further comprising:
forming at least one perpendicular magnetic tunnel junction (pMTJ) above the dielectric layer in the film thickness direction prior to cleaving the donor substrate, wherein the at least one pMTJ is formed at a temperature of about 300° C. or less.

11. The method as recited in claim 10, wherein forming the at least one pMTJ comprises:
forming a seed layer above the dielectric layer in the film thickness direction;
forming an underlayer above the seed layer in the film thickness direction;
forming a synthetic antiferromagnetic (SAF) seed layer above the underlayer in the film thickness direction;
forming a first SAF layer above the SAF seed layer in the film thickness direction;
forming a spacer layer above the first SAF layer in the film thickness direction;
forming an antiferromagnetic (AFM) coupling layer above the spacer layer in the film thickness direction;
forming a second SAF layer above the AFM coupling layer in the film thickness direction;
forming a ferromagnetic (FM) coupling layer above the second SAF layer in the film thickness direction;
forming a reference layer above the FM coupling layer in the film thickness direction;
forming a barrier layer above the reference layer in the film thickness direction;
forming a free layer above the barrier layer in the film thickness direction; and
forming at least one cap layer above the free layer in the film thickness direction.

12. The method as in claim 1, wherein the implanting ions further comprises implanting H+ and ions B+ions.

13. The method as in claim 7, wherein the implanting ions further comprises implanting H+ions and B+ions.

* * * * *